US010832770B2

(12) United States Patent
Al-Shamma et al.

(10) Patent No.: US 10,832,770 B2
(45) Date of Patent: Nov. 10, 2020

(54) SINGLE PULSE MEMORY OPERATION

(71) Applicant: SanDisk Technologies LLC, Addison, TX (US)

(72) Inventors: Ali Al-Shamma, San Jose, CA (US); Yadhu Vamshi Vancha, Rancho Cordova, CA (US); Jeffrey Lee, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/352,749

(22) Filed: Mar. 13, 2019

(65) Prior Publication Data

US 2020/0294584 A1 Sep. 17, 2020

(51) Int. Cl.
*G11C 13/00* (2006.01)
*H01L 45/00* (2006.01)
*H01L 27/24* (2006.01)

(52) U.S. Cl.
CPC ........ *G11C 13/0004* (2013.01); *G11C 13/004* (2013.01); *G11C 13/0028* (2013.01); *H01L 27/2436* (2013.01); *H01L 45/145* (2013.01)

(58) Field of Classification Search
CPC ............... G11C 11/0045; G11C 14/009; G11C 11/5678
USPC ................................................. 365/148, 163
See application file for complete search history.

(56) References Cited

U.S. PATENT DOCUMENTS

| 7,099,180 B1 | 8/2006 | Dodge et al. |
| 7,180,771 B2 | 2/2007 | Cho et al. |
| 7,280,390 B2 | 10/2007 | Kostylev et al. |
| 7,518,904 B2 | 4/2009 | Dodge et al. |
| 7,623,370 B2 | 11/2009 | Toda et al. |
| 7,920,407 B2 | 4/2011 | Chen et al. |
| 7,974,122 B2 | 7/2011 | Lin et al. |
| 8,238,149 B2 | 8/2012 | Shih et al. |
| 8,441,848 B2 | 5/2013 | Thiruvengadam et al. |
| 2008/0212363 A1* | 9/2008 | Fuji ................... G11C 13/0069 365/163 |
| 2009/0040814 A1 | 2/2009 | Kang et al. |
| 2011/0122683 A1 | 5/2011 | Dodge et al. |
| 2012/0051114 A1* | 3/2012 | Lee ........................ G11C 7/062 365/148 |
| 2012/0140574 A1* | 6/2012 | Lee ........................ G11C 7/065 365/189.06 |
| 2019/0383690 A1* | 12/2019 | Muraoka .................. B60K 1/04 |

* cited by examiner

*Primary Examiner* — Han Yang
(74) *Attorney, Agent, or Firm* — Vierra Magen Marcus LLP

(57) ABSTRACT

Apparatuses, systems, methods, and computer program products are disclosed for a single pulse memory operation. An electrical source is configured to generate an electrical pulse. A selector for a memory cell is configured to conduct an electrical pulse from an electrical source to a memory cell in response to the electrical pulse exceeding a threshold. A control circuit is configured to maintain at least an operational level for the electrical pulse for a predefined time period to perform an operation on the memory cell.

19 Claims, 17 Drawing Sheets

US 10,832,770 B2

SINGLE PULSE MEMORY OPERATION

TECHNICAL FIELD

The present disclosure, in various embodiments, relates to memory operations and more particularly relates to electrical pulses for memory operations.

BACKGROUND

Certain memory cells may have a selector, controlling when electrical signals may reach the memory cells. In order to perform a memory operation, a signal is first sent to turn on a selector, then a second signal is sent to perform the memory operation once the selector is on. Sending two separate signals for a memory operation, with a delay between the signals, adds time to a memory operation, having a negative impact on performance.

SUMMARY

Apparatuses are presented for a single pulse memory operation. An electrical source, in some embodiments, is configured to generate an electrical pulse. A selector for a memory cell, in one embodiment, is configured to conduct an electrical pulse from an electrical source to the memory cell in response to the electrical pulse exceeding a threshold. In certain embodiments, a control circuit is configured to maintain at least an operational level for an electrical pulse for a predefined time period to perform an operation on a memory cell.

Other apparatuses are presented for a single pulse memory operation. An apparatus, in one embodiment, includes means for popping a memory cell selector with an operation current such that the selector becomes conductive. In some embodiments, an apparatus includes means for setting a timer in response to a memory cell selector popping. An apparatus, in a further embodiment, includes means for supplying an operation current for at least a predefined time period based on a timer to perform an operation on a memory cell with the operation current.

Systems are presented for a single pulse memory operation. An array of phase change memory cells, in certain embodiments, have a reset amorphous state and a set crystalline state. In some embodiments, ovonic threshold switching (OTS) selectors are positioned between phase change memory cells and word lines of an array. An on-die controller, in one embodiment, is configured to supply a reset current to a word line associated with a phase change memory cell, activating an OTS selector and resetting the phase change memory cell to a reset amorphous state without the reset current falling below a reset current threshold.

Methods for a single pulse memory operation and computer program products with operations for a single pulse memory operation are also presented. One or more steps of a method and/or an operation may be substantially similar to one or more of the steps described above with regard to the disclosed apparatuses and systems.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
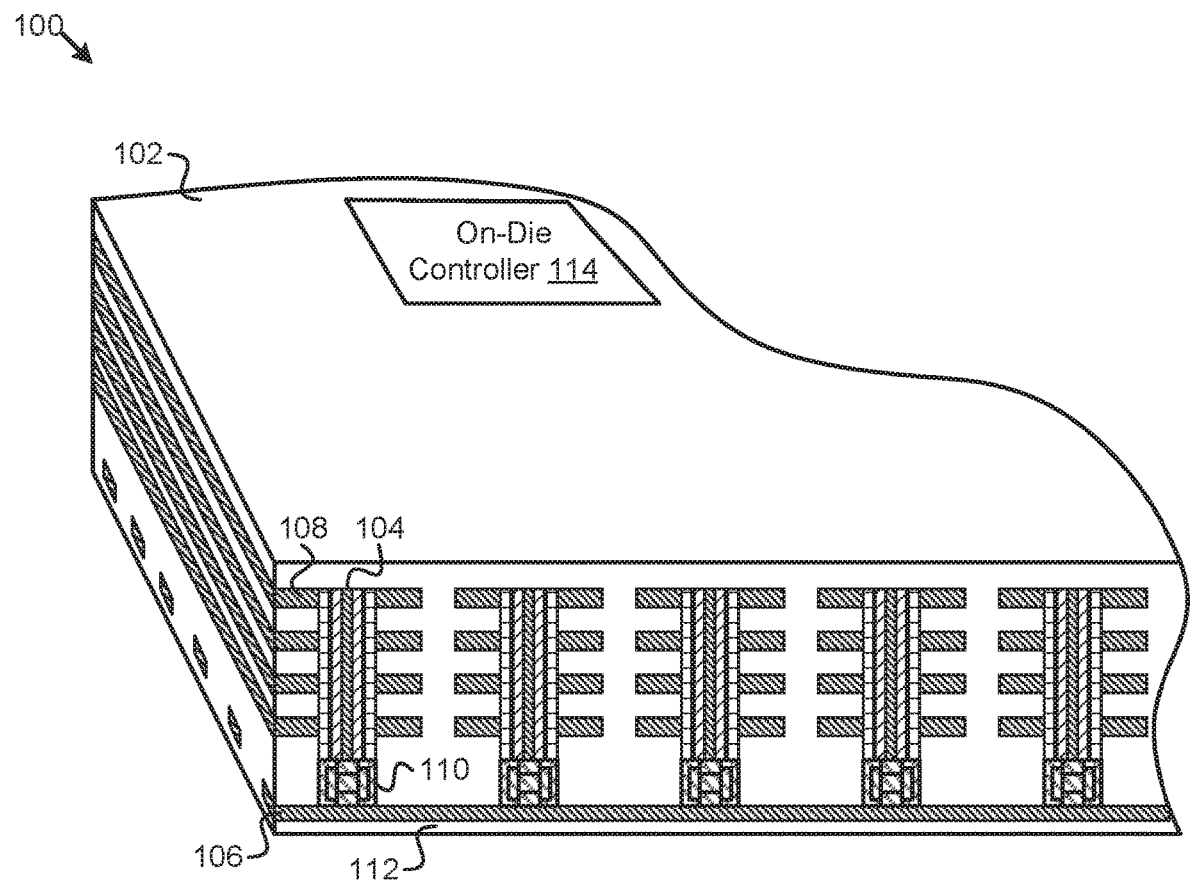
FIG. 1A is a schematic block diagram illustrating one embodiment of a system for a single pulse memory operation.

Aspects of the present disclosure may be embodied as an apparatus, system, method, or computer program product. Accordingly, aspects of the present disclosure may take the form of an entirely hardware embodiment or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures. Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A depicts a cutaway perspective view of one embodiment of a system 100 for a single pulse memory operation. The system 100, in the depicted embodiment, includes one or more non-volatile memory elements 102, each comprising an on-die controller 114, a substrate 112, a plurality of vertical memory structures 104, a plurality of bit lines 106, a plurality of word lines 108, and a plurality of switches 110. While three-dimensional (3D), vertical memory structures 104 (e.g., a 3D cross-point memory array) are used herein by way of example, in other embodiments, the system 100 may include two-dimensional (2D) memory structures, upon which one or more of the single pulse memory operations described herein may be performed in a substantially similar manner to that described with regard to the 3D vertical memory structures 104.

In general, a non-volatile memory element 102 comprises a non-volatile memory medium for storing data. The non-volatile memory element 102 may comprise and/or be part of a non-volatile memory device for storing data using an array of vertical memory structures 104, which may each comprise multiple two terminal memory cells of storage class memory, such as phase change memory (PCM) or the like. For example, the system 100 may comprise one or more non-volatile memory elements 102, such as one or more chips, packages, dies, die planes, and/or other integrated circuit memory devices (e.g., one or more monolithic, three-dimensional memory devices; semiconductor devices; and/or other solid-state devices) comprising a non-volatile memory medium.

In one embodiment, a non-volatile memory element 102 comprises a phase change memory device (e.g., a substrate 112 with an array of columns 104 and/or pillars 104 comprising phase change material for storing data). A phase change material, as used herein, comprises a material with a physical property that is switchable into multiple states. For example, chalcogenide glass phase change materials may be quickly heated and quenched (e.g., cooled) into an amorphous state (e.g., a "reset" state) or held in a crystallization temperature range to switch into a crystalline state (e.g., a "set" state). In certain embodiments, an amorphous state of a phase change material may have a higher electrical resistance than a crystalline state of the phase change material.

In a further embodiment, a phase change material may have more than two distinct states, such as an amorphous state, a crystalline state, and/or one or more partially crystalline and/or partially amorphous states, each of which may have different levels of resistance. In one embodiment, two states of a phase change material may be used to store a single bit of data per cell (e.g., two states per cell, single level cell (SLC) memory, or the like). In a further embodiment, more than two states of a phase change material may be used to store multiple bits of data per cell (e.g., multiple states per cell, multilevel cell (MLC) memory, triple level cell (TLC) memory, quadruple level cell (QLC) memory, or the like).

The on-die controller 114, in certain embodiments, may use different operations to place a memory cell into different states (e.g., to program the memory cell so store different data values) and/or to detect a state of a memory cell. An operation, as used herein, comprises an event or process associated with one or more memory cells. An operation, in various embodiments, may include a read or sense operation, a write or program operation, an erase operation, a PCM or ReRAM set or reset operation, a refresh operation, and/or another memory operation that changes and/or detects a state of a memory cell. For example, for PCM, ReRAM, and/or other storage class memory, the on-die controller 114 may use a reset operation to place a memory cell into a reset amorphous state and/or may use a set operation to place a memory cell into a set crystalline state, or the like.

To perform a set operation, a reset operation, a read operation, or the like on a memory cell, the on-die controller 114 may provide an electrical pulse to activate, turn on, and/or render conductive a selector (e.g., with a current and/or voltage satisfying a threshold of the selector, or the like). A selector, as used herein, comprises a non-linear element (NLE) or other switching element in electrical communication with a memory cell. Selectors may isolate different memory cells from each other, reducing program and/or read disturb effects that would otherwise occur during operations on neighboring memory cells. In response to the selector activating or turning on to conduct current, the on-die controller 114 may provide one or more electrical pulses for the set operation, reset operation, read operation, or the like.

A reset operation may have a higher voltage and/or current than a set operation, but may have a shorter duration than a set operation, to increase temperature of the phase change material of the memory cell past the material's melting point and allowing it to quickly cool in a reset amorphous state without crystallizing, while a longer set operation with a lower voltage and/or current may provide the phase change material of the memory cell with a longer cooling time at a lower temperature such that the material crystallizes into a set crystalline state. A read operation may have a lower voltage and/or current than either a reset or a set operation, allowing the on-die controller 114 to measure the state of a memory cell (e.g., the electrical resistance, whether the phase change material of the memory cell is crystalline or amorphous) without changing the state, with minimal disturbance to the state, or the like.

In certain embodiments, an on-die controller 114 may use a single electrical pulse to both activate a selector and to perform an operation on the associated memory cell. For example, the on-die controller 114 may monitor an electrical pulse (e.g., a voltage and/or current of the electrical pulse) on a word line 108 and/or bit line 106 for a memory cell to detect a spike and/or "pop" in the electrical pulse, indicating that the selector has been activated, turned on, is now conductive, or the like and may maintain a voltage and/or current of the electrical pulse at or above a threshold level for the operation in response to detecting the spike and/or pop.

Activating a selector for a memory cell and performing an operation on the memory cell both with a single electrical pulse, in some embodiments, may expedite the operation, taking less time than separate electrical pulses and/or allowing the memory element 102 to perform more input/output operations per second ("TOPS"), or the like. In one embodiment, activating a selector for a memory cell and performing an operation on the memory cell both with a single electrical pulse may be more power efficient than two separate pulses, as the operation may use some of the same electrical current from activating the selector (e.g., a predefined "soaking" period for an operation may begin when the selector pops, instead of beginning later when the on-die controller 114 provides a second electrical pulse).

The non-volatile memory element 102 may comprise a substrate 112 or other base or support structure. For example, the substrate 112 may comprise a silicon wafer (e.g., mono-crystal silicon wafer, silicon on sapphire), a gallium arsenide wafer, ceramic, or the like. In certain embodiments, the substrate 112 comprises one or more electrical connections (e.g., one or more pins, pads, leads, contacts, traces, electrically conductive holes, or the like) for the non-volatile memory element 102 to interface with a printed circuit board, packaging, and/or another electrical interface.

Several integrated circuit layers, in certain embodiments, may be deposited or otherwise formed on the substrate 112 to form the non-volatile memory element 102. In the depicted embodiment, the non-volatile memory element 102 includes a plurality of electrically conductive word lines 108 and bit lines 106, with electrically insulating material between the electrically conductive word lines 108 and bit lines 106 (e.g., between adjacent word lines 108 in the same layer, between word lines 108 in different layers, between global bit lines 106, between local bit lines 106, between word lines 108 and bit lines 106, and/or between other electrically conductive material of the non-volatile memory element 102). For example, the non-volatile memory element 102 may be formed with alternating layers of conductive material (e.g., metal) and insulating material (e.g., dielectric), or the like, using a masking process, a deposition process, and/or another similar process to form the word lines 108 and bit lines 106.

The vertical memory structures 104 comprise a non-volatile memory medium, such as a phase change material or the like, for storing data. In certain embodiments, the vertical memory structures 104 may be formed using an iterative, layered deposition process with the layers of word lines 108 and/or bit lines 106. In a further embodiment, one or more memory holes (e.g., openings) may be formed in the non-volatile memory element 102 during the fabrication and/or manufacturing process, in which the vertical memory structures 104 may be deposited and/or otherwise formed. For example, memory holes or other openings may be preserved using a masking process (e.g., to prevent the deposition of electrically conductive material or electrically insulating material), memory holes or other openings may be drilled, cut, etched, and/or otherwise formed after the layers of electrically conductive material and electrically insulating material have been deposited, or the like.

The vertical memory structures 104, in certain embodiments, are deposited or otherwise formed in memory holes or other openings in the layers of electrically conductive material and electrically insulating material on the substrate 112. Non-volatile memory cells, in one embodiment, are formed at the intersection of the word lines 108, the bit lines 106, and the vertical memory structures 104, forming a three-dimensional array of non-volatile memory cells.

In one embodiment, a non-volatile memory medium of the vertical memory structures 104 (e.g., a phase change material or the like) and/or one or more other layers (e.g., a separation layer, a selector layer, a central bit line 106 layer, or the like) may be deposited in a memory hole or other opening using an atomic layer deposition (ALD) process and/or another thin film or chemical vapor deposition (CVD) process. For example, a sequence of precursor chemicals (e.g., alternate gaseous species, or the like) may be exposed to a surface of the memory hole or other opening, which acts as a substrate upon which the intended layer is grown (e.g., a layer of phase change material or other non-volatile memory medium, a separation layer of carbon and/or an oxide, a selector layer of a different phase change material, a metallic central bit line 106 layer, or the like). In one embodiment, multiple precursors may be used simultaneously. In another embodiment, different precursors may be inserted in a series of sequential, non-overlapping pulses, or the like. In certain embodiments, the precursor molecules react with the surface in a self-limiting way, so that the reaction terminates once all the reactive sites on the surface are consumed (e.g., an ALD cycle). In other embodiments, a direct liquid injection (DLI) vaporizer deposition process may be used, a physical vapor deposition (PVD) process may be used, or the like.

The vertical memory structures 104, in one embodiment, comprise multiple layers, such as a conductive bit line 106 layer (e.g., a local bit line 106, a central bit line 106, a vertical bit line 106, or the like), a non-volatile memory medium layer (e.g., a phase change memory material layer, or the like), a separation layer (e.g., a carbon layer, an oxide layer, or the like), a selector layer (e.g., a different phase change material layer, or the like), and/or another layer. In the depicted embodiment, each vertical memory structure 104 includes a central, vertical, electrically conductive bit line 106, with a phase change material disposed on at least two sides of the bit line 106 (e.g., on two, opposite sides of the bit line 106; surrounding the bit line 106; or the like) as a non-volatile memory medium, a different phase change material disposed on at least two sides of the vertical memory structure 104 (e.g., on two, opposite sides of the vertical memory structure 104; surrounding the vertical memory structure 104; or the like), and a carbon separation layer disposed between the phase change material and the different phase change material. One or more word lines 108, in the depicted embodiment, are in electrical communication (e.g., in contact with) a selector layer (e.g., the different phase change material), forming one or more memory cells between each word line 108 and associated bit line 106.

In one embodiment, a phase change material includes a chalcogenide glass material. For example, a phase change material suitable for a non-volatile memory medium may have a composition of $Ge_xSb_yTe_z$, or the like. In certain embodiments, x=2, y=2 and z=5 for a composition of $Ge_2Sb_2Te_5$, but other $Ge_xSb_yTe_z$ materials may be used. In other embodiments, a phase change material suitable for a non-volatile memory medium may comprise one or more of AsTeGeSi, AsTeGeSiN, GeSe, GeSb, AgInSbTe, GeTe, (e.g., $GeTe_6$ or the like), GaSb, BaSbTe, InSbTe and/or one or more other combinations of these elements (e.g., other combinations of one or more of As, Te, Ge, Si, N, Se, Sb, Ag, In, Ga, Ba, or the like).

A selector layer, in certain embodiments, may reduce and/or eliminate sneak path currents that may cause disturb effects and/or higher currents, allowing for a larger memory array size (e.g., more memory cells) than would be possible without selectors. In one embodiment, a selector comprises a non-linear element (NLE) and/or a switching element in electrical communication with a non-volatile memory medium (e.g., a phase change material or the like). A selector may provide selectivity for different memory cells of the non-volatile memory medium. Examples of selectors, in various embodiments, may include a diode, a transistor, a switch, a semiconductor, an inductor and/or transformer operated above its saturation current, or the like.

In one embodiment, a selector comprises an ovonic threshold switch (OTS) formed of a different phase change material than the non-volatile memory medium (e.g., a different chalcogenide glass material). An ovonic threshold switch may comprise a two-terminal symmetrical voltage sensitive switching device (e.g., current isolation device) comprising a chalcogenide and/or other phase change material, with at least a blocking state and a conducting state, or the like. In response to a voltage potential between a word line 108 and a bit line 106 exceeding a threshold voltage of an ovonic threshold switch for a non-volatile memory cell, the ovonic threshold switch becomes conductive, selecting the non-volatile memory cell and conducting electric current to the non-volatile memory cell.

An ovonic threshold switch selector, in various embodiments, may comprise a chalcogenide phase change material (e.g., an ovonic threshold switching material) such as AsTeGeSi, AsTeGeSiN, GeTe, GeSe, ZnTe, and/or one or more other combinations of these elements (e.g., other combinations of As, Te, Ge, Si, N, Se, Zn, or the like). A phase change material used for a selector (e.g., an ovonic threshold switching material), in one embodiment, has a higher melting point and/or phase change point than a melting point and/or phase change point of a phase change material used as a non-volatile memory medium. In this manner, in certain embodiments, the selector maintains its properties and does not change states or phases during normal operation (e.g., typical temperatures, voltages, and/or currents) of the non-volatile memory element 102, even when the non-volatile memory medium phase change material changes states or phases (e.g., OTS of the material is "locked" or otherwise remains in an amorphous state during operation, or the like). In other embodiments, instead of a phase change material such as an OTS material, selectors for the vertical memory structure 104 may comprise a poly junction selector (e.g., a Si PN junction or the like), an oxide junction selector (e.g., an $O_x$ PN junction or the like), an oxide rectifier, a mixed-ionic-electronic-conduction (MIEC) based selector (e.g., $Cu^+$ in SE or the like), a metal-insulator-metal (MIM) junction, a metal-insulator-semiconductor (MIS) junction, a metal-semiconductor (MS) Schottky junction, or the like.

In the depicted embodiment, the non-volatile memory medium (e.g., a phase change material) and the selector (e.g., a different phase change material such as an OTS material) are in series between a word line 108 and a bit line 106, and are separated by a separation layer, which may comprise carbon, an oxide, or the like. Using two different types of phase change material, one as a non-volatile memory medium and one as a selector, in certain embodiments, may allow both to be formed using similar deposition processes (e.g., atomic layer deposition or the like), to operate in similar conditions (e.g., similar current density or the like), to be arranged in series (e.g., since both are two terminal devices), and/or to have other beneficial similarities.

However, in certain embodiments, due to the similarities between a phase change material of a non-volatile memory medium and a phase change material of a selector and/or due to the repeated melting and quenching of a phase change material or the like, the different phase change materials may intermix over time if placed in direct contact with each other.

Each vertical memory structure 104, in one embodiment, includes one or more separation layers between different phase change materials (e.g., between a phase change material of a non-volatile memory medium and a phase change material, such as an OTS material, of a selector), to reduce and/or prevent intermixing of the different materials during high temperatures or the like.

In one embodiment, a separation layer comprises carbon. In another embodiment, a separation layer comprises an oxide. A carbon separation layer, in certain embodiments, may comprise a conductive form (e.g., graphene like-carbon), an insulating form (e.g., amorphous carbon), and/or another material comprising carbon. The difference conductive and insulating carbon materials is the content of the carbon chemical bonds (e.g., sp2 and/or sp3 hybridizations). In the sp3 configuration, the carbon valence electrons are kept in strong covalent bonds and as a result the sp3 hybridization is non-conductive. Carbon films in which the sp3 configuration dominates, may be referred to as tetrahedral-amorphous carbon, or diamond like. In the sp2 configuration, not all the carbon valence electrons are kept in covalent bonds. The weak tight electrons (e.g., phi bonds) contribute to the electrical conduction making the mostly sp2 configuration a conductive carbon material. In a further embodiment, where the separation layer comprises an oxide and/or a nitride material, the separation layer may comprise one or more of SiO, SiN, AlO, AlN, TaO, HfO, ZrO, TiO, NiO, WO, CoO, VO, NbO, CuO, ZnO, MoO, IrO, MgO, etc (e.g., SiO may be stoichiometric $SiO_2$ or non-stoichiometric $SiO_x$ where x does not equal to 2, or the like).

In certain embodiments, a separation layer comprising carbon may perform better at higher temperatures than a separation layer comprising an oxide, a nitride, or the like. A resistance of a separation layer (e.g., comprising carbon, an oxide, a nitride, or the like), a resistance of a phase change material itself, a resistance of a word line 108 (e.g., a metallic plug), or the like, in one embodiment, may heat the phase change material in response to receiving an electrical current from a selector (e.g., a different phase change material), in order to change the state or phase of the phase change material.

Thicknesses of layers in a vertical memory structure 104, in various embodiments, may range between about 1 nm and 500 nm. As described above, in response to a higher energy pulse applied for a shorter time, a region of the phase change material may melt and "quench" in an amorphous state, which is a lower conductive state. In response to a lower energy pulse applied for a longer time, such that the temperature remains above the crystallization temperature but below the melting temperature, the region of the phase change material may crystallize in a poly-crystal phase, which is a higher conductive state. In certain embodiments, instead of or in addition to relying on resistances of a separation layer and/or of the phase change material itself, one or more contacting electrodes may be used, comprising a high melting metal such as TiN, W, WN, TaN, or the like.

While a phase change material is used herein as the primary embodiment of a non-volatile memory medium of the non-volatile memory element 102 (e.g., PCM, PCME, PRAM, PCRAM, ovonic unified memory, chalcogenide RAM, or C-RAM), in other embodiments the non-volatile memory element 102 may comprise ReRAM, Memristor memory, programmable metallization cell memory, phase-change memory, NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS) memory, programmable metallization cell (PMC) memory, conductive-bridging RAM (CBRAM), magneto-resistive RAM (MRAM), or the like. The non-volatile memory medium of the non-volatile memory element 102, in certain embodiments, may comprise a storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other legacy technologies. For example, storage class memory may comprise one or more non-volatile memory elements 102 of phase-change memory, ReRAM, Memristor memory, programmable metallization cell memory, nano RAM, nanocrystal wire-based memory, silicon-oxide based sub-10 nanometer process memory, graphene memory, SONOS memory, PMC memory, CBRAM, MRAM, and/or variations thereof.

In the depicted embodiment, each vertically oriented 3D phase change memory element comprises memory cells at the cross-points of the word lines 108 and bit lines 106 (e.g., the horizontal global bit lines 106; the vertical, central, and/or local bit lines 106 within a vertical memory structure 104; or the like). In this manner, several memory cells (e.g., 2 memory cells, 4 memory cells, 8 memory cells, 16 memory cells, 32 memory cells, 64 memory cells, or the like) may be implemented by a single continuous layer of material (e.g., phase change material). For example, in the depicted embodiment, strips and/or layers of phase change material or other non-volatile memory material are oriented vertically along opposite sides of the vertical memory structure 104, with 4 word lines 108 on each opposite side as well to form the memory cells. In certain embodiments, word lines 108 and strips and/or layers of insulating material under them in a group of planes may be defined simultaneously by use of a single mask, thus simplifying the manufacturing process.

In the depicted embodiment, planes comprising the word lines 108 have substantially the same horizontal pattern of conductive, insulating, and phase change materials. In each plane, electrically conductive (e.g., metal) word lines 108 (e.g., WLzx) are elongated in a first direction and spaced apart in a second direction. Each plane includes a layer of insulating material (e.g., a dielectric) that isolates the plane's word lines 108 from the word lines 108 of the plane below it and/or of the substrate 112 circuit components below it. In some embodiments, the word lines 108 WLzx for a fixed value of x form a stack of alternating layers that may extend beyond the memory element 102 into a contact area (not shown), or the like.

Extending through each plane, in the depicted embodiment, is an array of electrically conductive (e.g., metal) local bit line (LBL) "columns," "layers," and/or "pillars" within each vertical memory structure 104 (e.g., a central, vertical bit line), elongated in the vertical direction, perpendicular to the word lines 108. Each vertical memory structure 104 (e.g., through the associated internal local bit line column and/or layer) is connected to one of a set of underlying global bit lines (GBL) 106 (e.g., located in the silicon substrate 112) running horizontally (e.g., in a parallel plane to the word lines 108, but elongated in a different, perpendicular direction than the word lines 108), at the same pitch as a column spacing of the vertical memory structures 104, connected through the switch devices 110. The switch devices 110 selectively place the global bit lines 106 in electric communication with the vertical, central, local bit lines 106 within the vertical memory structures 104. For example, the switch devices 110 may comprise transistors (e.g., vertically oriented field effect transistors), one of the selector devices described above, and/or another type of switch. The switch devices 110 may be formed in or on the substrate 112. The switch devices 110 may have gates driven by row select lines (SG) (e.g., also formed in the substrate or the like). Also fabricated in or on the substrate 112, in certain embodiments, may be sense amplifiers, input-output (I/O) circuitry, control circuitry, and/or other peripheral circuitry. There may be one row select line (SG) for each row of vertical memory structures 104 (e.g., columns and/or pillars) and one select device (Q) for each individual local bit line (LBL) within each vertical memory structure 104.

Each vertical strip and/or layer of non-volatile memory material (e.g., phase change material) is sandwiched between the vertical local bit lines (LBL) and the plurality of word lines (WL) 108. As described above, in certain embodiments, a selector layer (e.g., comprising a different phase change material such as an OTS material) and/or a separation layer (e.g., carbon or the like) may be disposed between the word lines 108 and the non-volatile memory material (e.g., phase change material). In this manner, in certain embodiments, a memory cell is located at each intersection of a word line 108 and a local bit line 106 (e.g., with a vertical stack of memory cells at intersections of the word lines 108 and the global bit lines 106), which may controllably be alternated between more conductive (set) and less conductive (reset) states by appropriate currents and/or voltages applied to the intersecting lines to store data. Using selectors and the switch devices 110, in one embodiment, the non-volatile memory element 102 may be bit addressable.

While the non-volatile memory medium is referred to herein as "memory medium," in various embodiments, the non-volatile memory medium may more generally comprise one or more non-volatile recording media capable of recording data, which may be referred to as a non-volatile memory medium, a non-volatile storage medium, or the like. Further, the non-volatile memory element 102, in various embodiments, may comprise and/or be referred to as a non-volatile recording element, a non-volatile storage element, or the like.

The non-volatile memory element 102, in various embodiments, may be disposed in one or more different locations relative to the computing device or other host. In one embodiment, the non-volatile memory element 102 may comprise one or more semiconductor die, chips, packages, and/or other integrated circuit devices disposed on one or more printed circuit boards, storage device housings, and/or other mechanical and/or electrical support structures. For example, one or more non-volatile memory elements 102 may be disposed on one or more direct inline memory module (DIMM) cards, one or more expansion cards and/or daughter cards, a solid-state-drive (SSD) or other hard drive device, and/or may have another memory and/or storage form factor. The non-volatile memory element 102 may be integrated with and/or mounted on a motherboard of a computing device, installed in a port and/or slot of a computing device, installed on a remote computing device and/or a dedicated storage appliance on a data network, may be in communication with a computing device over an external bus (e.g., an external hard drive), or the like.

The non-volatile memory element 102, in one embodiment, may be disposed on a memory bus of a processor (e.g., on the same memory bus as volatile memory, on a different memory bus from volatile memory, in place of volatile memory, or the like). In a further embodiment, the non-volatile memory element 102 may be disposed on a peripheral bus of a computing device, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory element 102 may be disposed on a data network, such as an Ethernet network, an Infiniband network, SCSI RDMA over a network, a storage area network (SAN), a local area network (LAN), a wide area network (WAN) such as the Internet, another wired and/or wireless network, or the like.

A non-volatile memory controller may be communicatively coupled to the non-volatile memory element 102 by way of a bus, may be part of the same integrated circuit and/or package as the non-volatile memory element 102, or the like. A bus may comprise an I/O bus for communicating data to/from the non-volatile memory elements 102. A bus may comprise a control bus for communicating addressing and/or other command or control information to the non-volatile memory elements 102. In some embodiments, a bus may communicatively couple multiple non-volatile memory elements 102 to a non-volatile memory controller in parallel. This parallel access may allow multiple non-volatile memory elements 102 to be managed as a group, forming a logical memory element or the like. A logical memory element may be partitioned into respective logical memory units (e.g., logical pages) and/or logical memory divisions (e.g., logical blocks). The logical memory units may be formed by logically combining physical memory units of each of the non-volatile memory elements.

A non-volatile memory controller may organize a block of word lines 108 within a non-volatile memory element 102, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines 108 within a non-volatile memory element 102 may be physically arranged in a monotonically increasing sequence of word line addresses, with consecutively addressed word lines also being physically adjacent (e.g., WL0, WL1, WL2, WLN). In other embodiments, different addressing systems may be used.

Figure 1B:
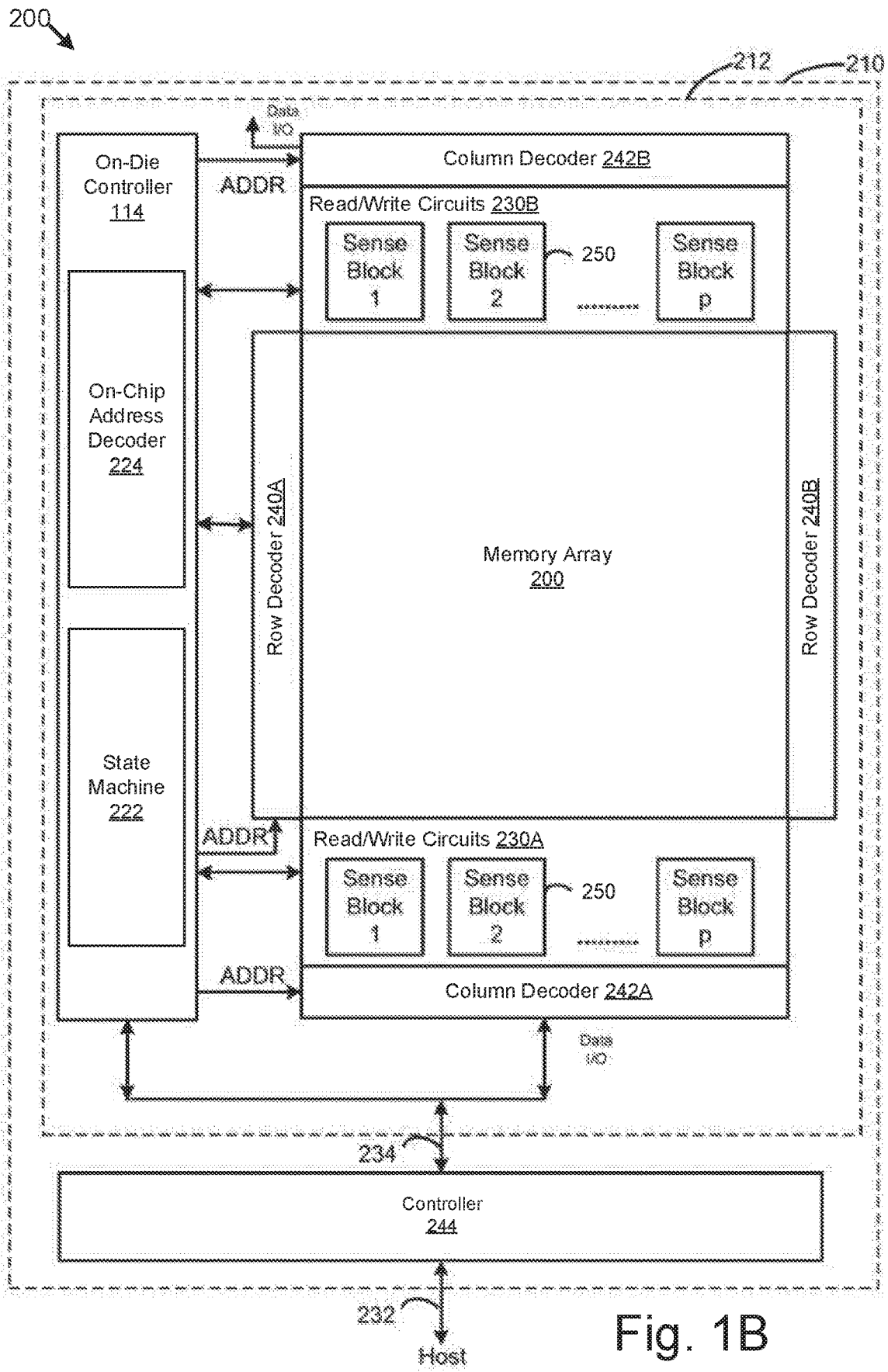
FIG. 1B is a schematic block diagram illustrating another embodiment of a system for a single pulse memory operation.

FIG. 1B depicts one embodiment of a system 200 for a single pulse memory operation. The system 200, in the depicted embodiment, includes a non-volatile storage device 210. A non-volatile storage device 210 may include one or more memory die 212, die planes 212, and/or chips 212, which may be substantially similar to the non-volatile memory element 102 of FIG. 1A. A memory die 212, in the depicted embodiment, includes an array of memory cells 200 (e.g., a three-dimensional array of vertical memory structures 104 as described above with regard to FIG. 1A, a two-dimensional array of memory cells, or the like), an on-die controller 114, and read/write circuits 230A/230B. In one embodiment, access to the memory array 200 by the various peripheral circuits is implemented in a symmetric fashion, on opposite sides of the array, so that the densities of access lines and circuitry on each side are reduced by half.

The read/write circuits 230A/230B, in a further embodiment, include multiple sense blocks 250 which allow a page of memory cells to be read or programmed in parallel.

The memory array 200, in various embodiments, is addressable by word lines 108 via row decoders 240A/240B and by bit lines 106 via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

The on-die controller 114, in one embodiment, cooperates with the read/write circuits 230A/230B to perform memory operations on the memory array 200. For example, the read/write circuits 230A/230B may comprise one or more electrical sources (e.g., one or more word line drivers, bit line drivers, sense amplifiers, charge pumps, voltage supplies, current sources, power supplies, or the like) configured to generate electrical pulses to perform reset operations, set operations, read operations, or the like on memory cells of the memory array 200 for the on-die controller 114. The on-die controller 114, in certain embodiments, includes a state machine 222, and an on-chip address decoder 224.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In one embodiment, one or any combination of the on-die controller 114, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

In the depicted embodiment, at least a portion of the management circuits (e.g., the on-die controller 114, decoder circuit 224, state machine circuit 222, decoder circuit 242A, decoder circuit 242B, decoder circuit 240A, decoder circuit 240B, read/write circuits 230A, and/or read/write circuits 230B) are disposed around an edge and/or periphery of the memory array 200, within the memory die 210. In another embodiment, at least a portion of the management circuits (e.g., the on-die controller 114, decoder circuit 224, state machine circuit 222, decoder circuit 242A, decoder circuit 242B, decoder circuit 240A, decoder circuit 240B, read/write circuits 230A, and/or read/write circuits 230B) may be disposed beneath the memory array 200, using a CMOS under the array (CUA) technique, or the like. Placing certain management circuits beneath the memory array 200, in certain embodiments, may allow additional space on the die 212 for a larger memory array 200 and/or for more management circuits, more complex or advanced management circuits, or the like. In a further embodiment, at least a portion of the management circuits (e.g., the on-die controller 114, decoder circuit 224, state machine circuit 222, decoder circuit 242A, decoder circuit 242B, decoder circuit 240A, decoder circuit 240B, read/write circuits 230A, and/or read/write circuits 230B) may be disposed on a different die 212 adjacent and/or coupled to the memory die 212 (e.g., with one or more conductive connectors, through-silicon vias, or the like).

Figure 2A:
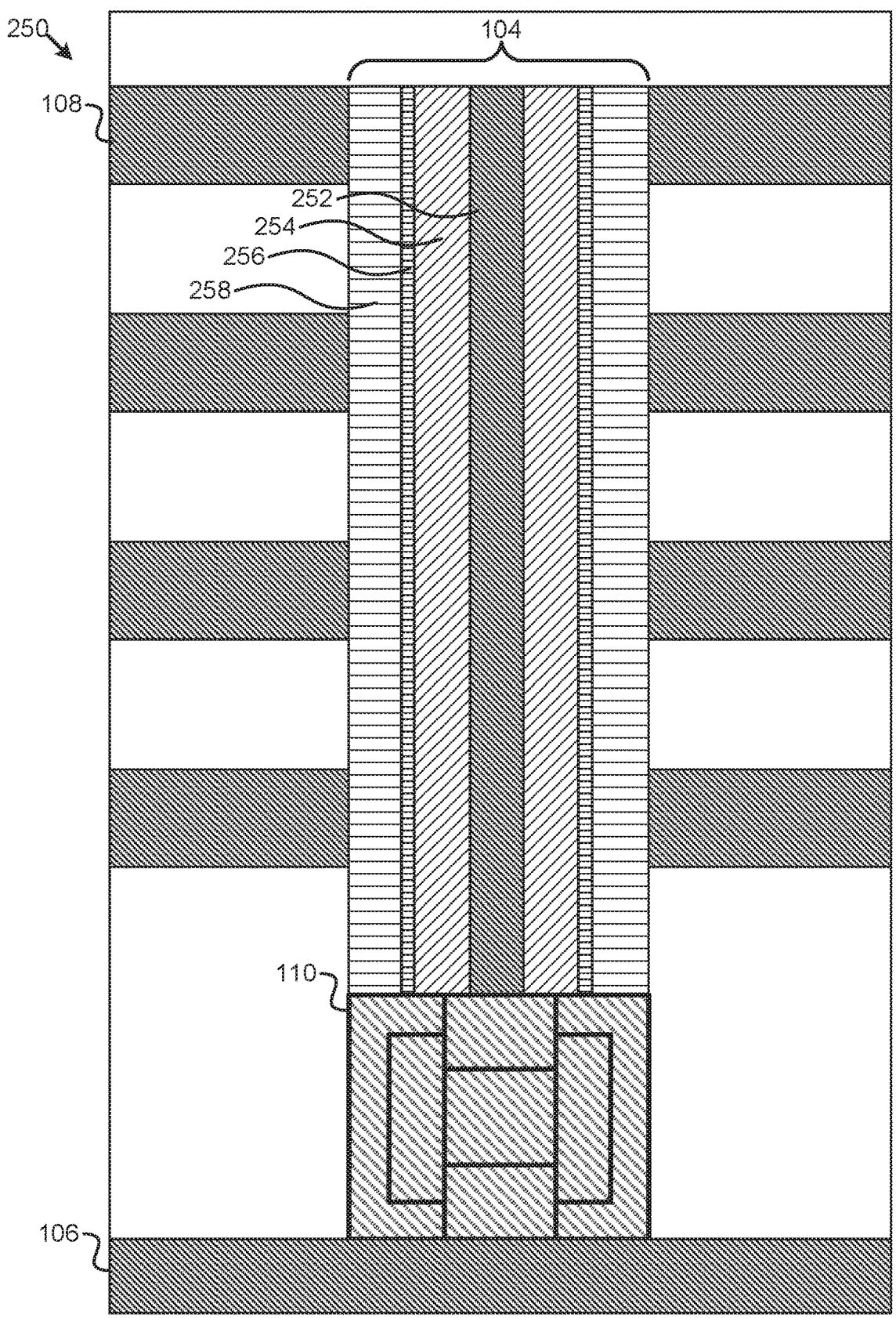
FIG. 2A is a schematic block diagram illustrating one embodiment of a vertical phase change memory structure.

FIG. 2A depicts one embodiment of a vertical phase change memory structure 250. In certain embodiments, the depicted vertical column 104, global bit line 106, word lines 108, and switch device 110 may be substantially similar to those described above with regard to FIG. 1A.

The vertical column 104, in one embodiment, comprises a central bit line conductor 252 (e.g., a local bit line 252, a vertical bit line 252, or the like), which the switch device 110 selectively places in electrical communication with the global bit line 106, as described above with regard to FIG. 1A. For example, the central bit line conductor 252 may be metallic and/or may comprise another electrically conductive material.

On at least two sides of the central bit line conductor 252 is disposed a layer of phase change material 254 (e.g., vertical strips and/or layers on two opposite sides, on three sides, on four sides, or the like; circumscribing the central bit line conductor 252; or the like). Between the layers of phase change material 254 and the word lines 108, in the depicted embodiment, are layers of a different phase change material 258 (e.g., ovonic threshold switching (OTS) selector layers), which act as selectors for the memory cells formed in the phase change material 254 by the word lines 108 and the central bit line conductor 252.

In the depicted embodiment, the different phase change material 258 comprises a continuous vertical strip and/or single layer along the length of the vertical column 104. A separation layer 256 (e.g., comprising carbon, an oxide, a nitride, or the like) is disposed between the layer of phase change material 254 and the layer of the different phase change material 258 (e.g., a selector layer), as described above. In this manner, in the depicted embodiment, a word line 108, a selector 258, a separation layer 256, a phase change material 254, and a central bit line conductor 252 are electrically coupled in series, forming a two terminal memory cell, with multiple memory cells formed along opposite sides of the central bit line conductor 252 in a vertical, 3D array.

Figure 2B:
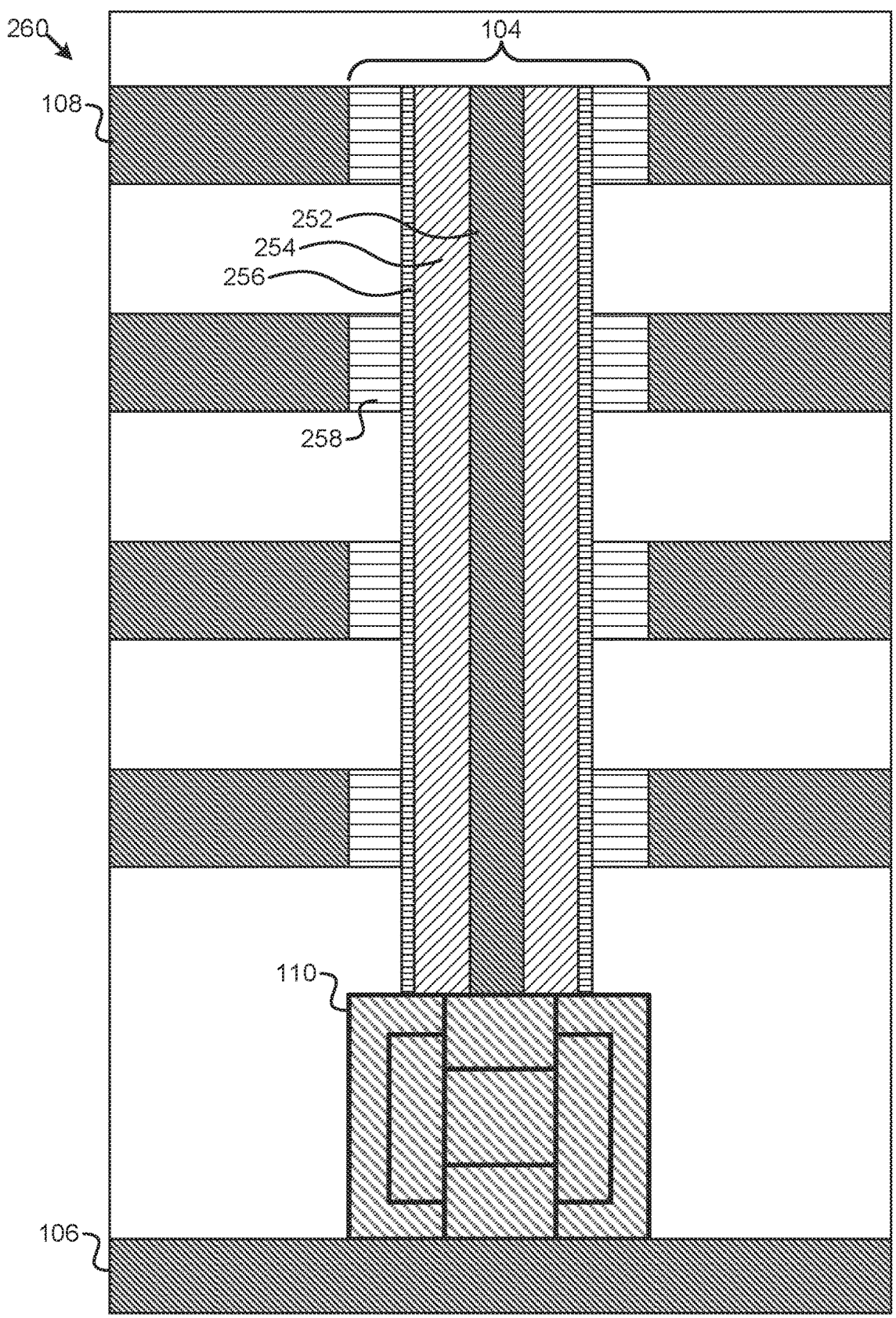
FIG. 2B is a schematic block diagram illustrating a further embodiment of a vertical phase change memory structure.

FIG. 2B depicts a further embodiment of a vertical phase change memory structure 260. The depicted embodiment may be substantially similar to the vertical phase change memory structure 250 of FIG. 2A, but the different phase change material 258 (e.g., selector 258), instead of comprising a strip and/or single layer along the entire length of the vertical column 104, is disposed in recessed word line openings, between the word lines 108 and the separation layer 256.

In a further embodiment, the separation layer 256 is also disposed in the recessed word line openings (e.g., holes or other openings in a sidewall of oxide adjacent to the memory hole of the column 104 or the like) with the different phase change material 258 (e.g., between the different phase change material 258 and the phase change material 254). In another embodiment, the different phase change material 258, the separation layer 256, and the phase change material 254 are all disposed within the word line openings, with the central bit line conductor 252 extending along the entire length of the vertical column 104 (e.g., between a top word line 108 and a switch device 110, or the like).

In certain embodiments, the vertical phase change memory structure 260 may be more cost effective than the vertical phase change memory structure 250 of FIG. 2A, because a smaller diameter memory hole may be used for depositing the vertical column 104, less phase change material 258 may be used, or the like. The vertical phase change memory structure 260, in certain embodiments, may be created by forming a switch device 110 (e.g., a transistor) on a substrate, depositing alternating layers of oxide and conductors to form the word lines 108, etching and/or drilling a memory hole for the column 104, creating recessions in the word lines 108 (e.g., creating a concave and/or re-entrant profile using a chemical that dissolves and/or eats away metal of the word lines 108 but leaves the oxide layers), depositing the different phase change material 258, re-etching and/or re-drilling the memory hole (e.g., to remove excess phase change material 258 from the sidewalls and/or bottom of the memory hole), depositing the separation layer 256, re-etching and/or re-drilling the memory hole (e.g., to remove excess separation layer material 256 from the bottom of the memory hole), depositing the phase change material 254, re-etching and/or re-drilling the memory hole (e.g., to remove excess phase change material 254 from the bottom of the memory hole), and/or depositing the central bit line conductive material 252, or the like. The vertical phase change memory structure 250 of FIG. 2A may be formed using a similar process, but without creating the recessions in the word lines 108, but instead depositing a continuous vertical strip and/or layer of the different phase change material 258, or the like.

Figure 3:
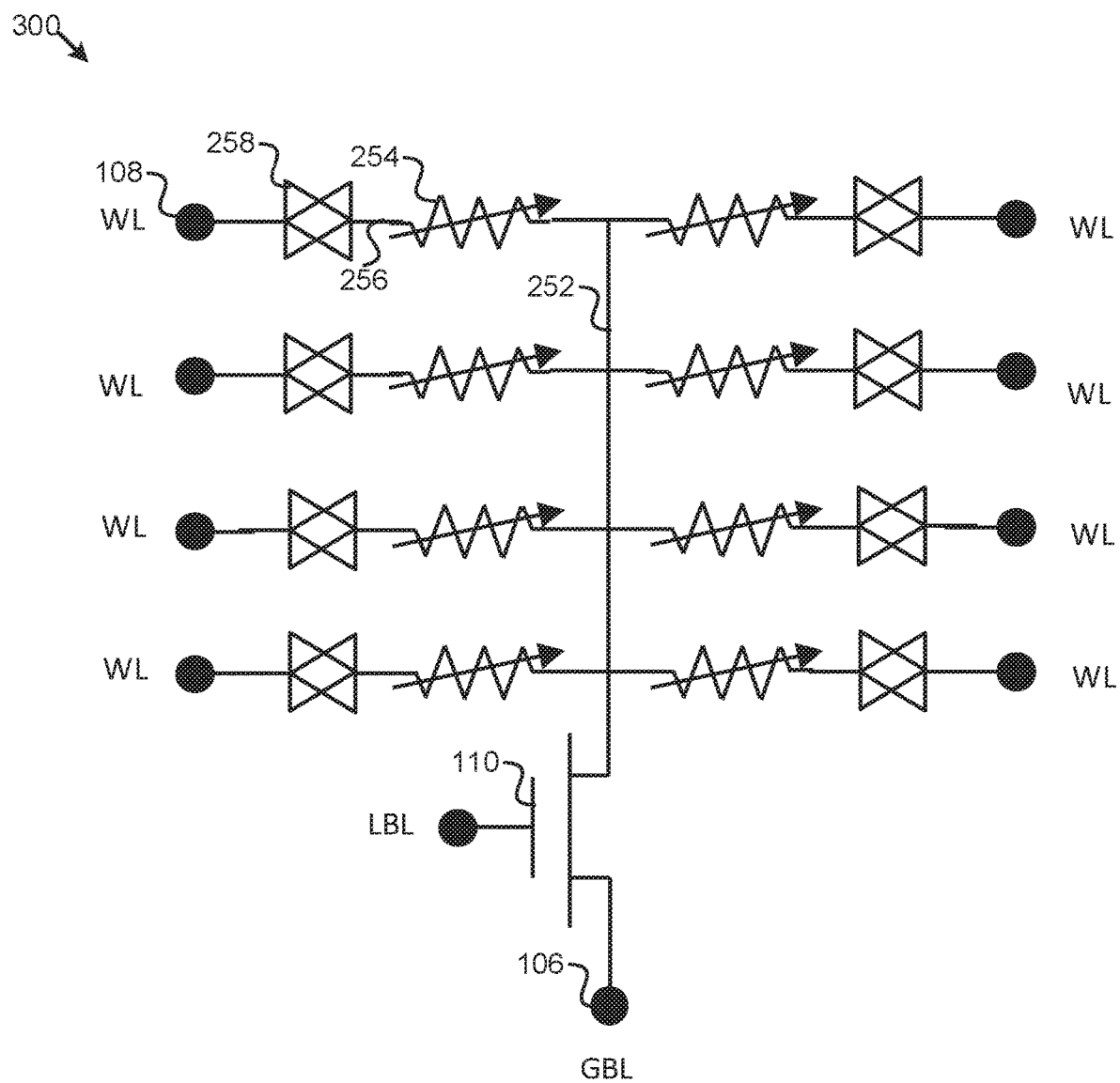
FIG. 3 is a schematic block diagram illustrating one embodiment of an electrical circuit for a vertical phase change memory structure.

FIG. 3 depicts one embodiment of an electrical circuit 300 for a vertical phase change memory structure. The electrical circuit 300, in the depicted embodiment, includes a plurality of word lines 108, each coupled to a different selector 258 (e.g., comprising a different phase change memory material 258, or the like). A separation layer 256 (e.g., an oxide) separates the selectors 258 from a phase change memory cell 254 (e.g., represented as a variable resistance element 254).

Each phase change memory cell 254, in the depicted embodiment, is coupled to a central bit line conductor 252, which a switch 110 (e.g., a transistor) selectively places in communication with a global bit line 106. While the depicted embodiment of the electrical circuit 300 illustrates four word lines 108 and associated phase change memory cells 254 on each of two opposite sides of the central bit line conductor 252, in other embodiments, different numbers and arrangements of word lines 108 and phase change memory cells 254 may be used.

Figure 4:
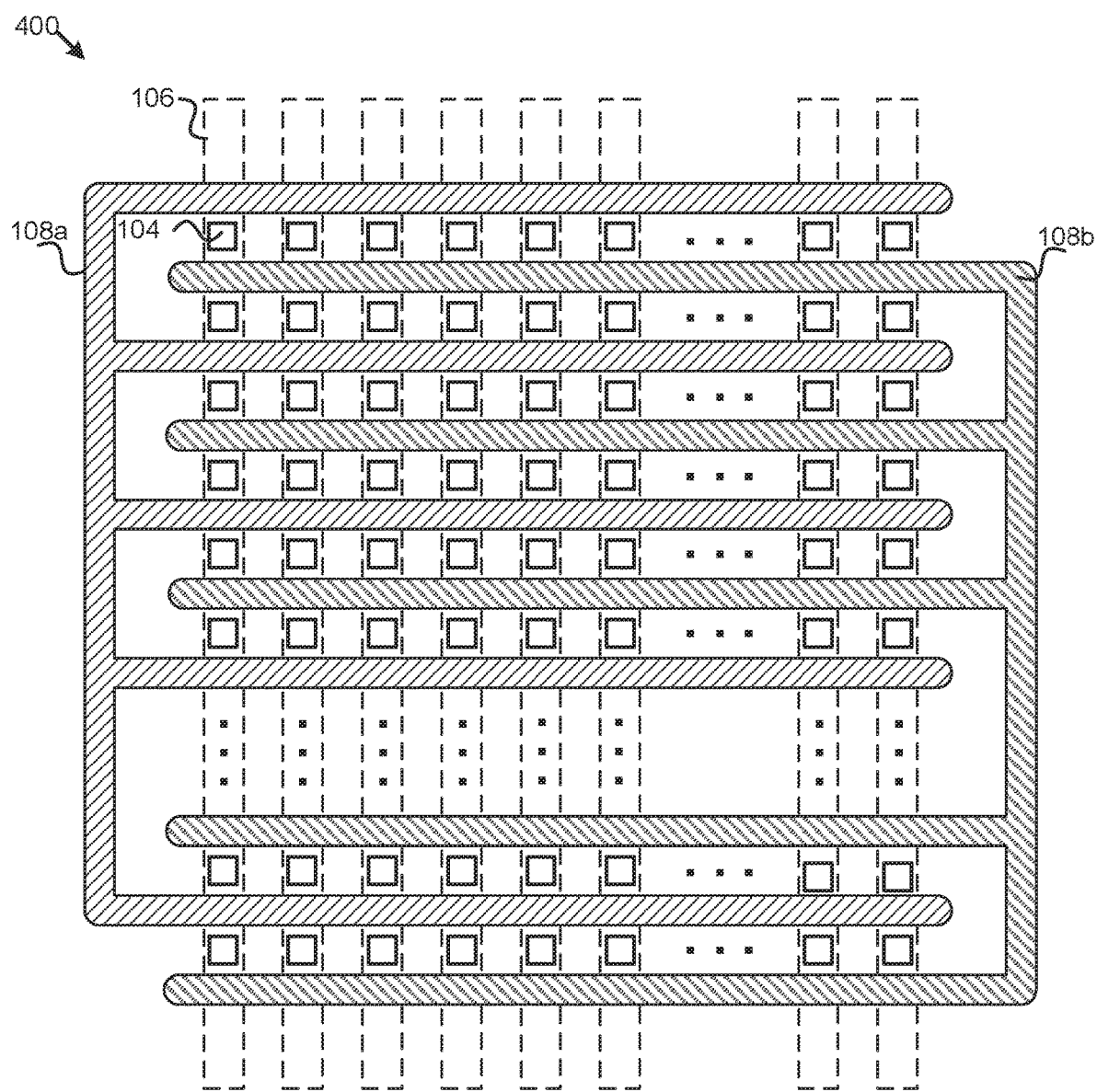
FIG. 4 is a schematic block diagram illustrating one embodiment of a system for vertical phase change memory.

FIG. 4 depicts one embodiment of a system 400 for vertical phase change memory. In the depicted embodiment, a plurality of columns 104 extend in a first direction (e.g., a vertical direction relative to a substrate 112), with two word lines 108a, 108b each comprise a plurality of fingers and/or extensions, interlocking and alternating with each other, elongated in a second direction perpendicular to the first direction (e.g., a first horizontal direction, parallel to a substrate 112), and a plurality of bit lines 106 (e.g., global bit lines 106) elongated in a third direction perpendicular to both the first direction and the second direction (e.g., a second horizontal direction, parallel to a substrate 112 and perpendicular to the first horizontal direction).

In this manner, in certain embodiments, different word lines 108a, 108b are disposed on opposite sides of each column 104. Due to the multiple fingers of the word lines 108a, 108b, in certain embodiments, a word line 108a, 108b may be associated with memory cells from more than one row of columns 104. The system 400, in one embodiment, may be referred to as a vertical cross-point type array, with memory cells formed at the cross-points and/or intersections of the columns 104, the bit lines 106, and one of the word lines 108a, 108b. In other embodiments, other arrangements and architectures of word lines 108a, 108b may be used.

Figure 5:
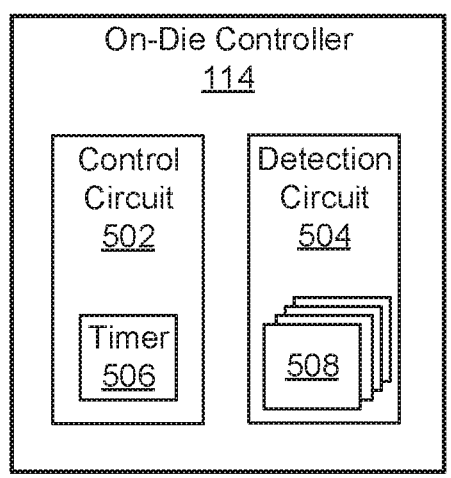
FIG. 5 is a schematic block diagram illustrating one embodiment of an on-die controller.

FIG. 5 depicts one embodiment of an on-die controller 114. The on-die controller 114, in certain embodiments, may be substantially similar to the on-die controller 114 described above with regard to FIG. 1A and/or FIG. 1B. The on-die controller 114, in the depicted embodiment, includes a control circuit 502 with a timer 506 and a detection circuit 504 with a plurality of current mirrors 508.

In one embodiment, the control circuit 502 is configured to manage and/or control one or more electrical sources for an array 200 of memory cells. An electrical source, as used herein, comprises an electrical circuit or other component capable of providing, generating, and/or receiving an electrical voltage and/or current. For example, in various embodiments, an electrical source may comprise a word line driver, a bit line driver, a sense amplifier, a charge pump, a voltage supply, a current source, a power supply, or the like. The control circuit 502 may be configured to command, signal, and/or otherwise cause an electrical source to generate an electrical pulse for an operation (e.g., a reset current/voltage, a set current/voltage, a read current/voltage, or the like).

The electrical pulse, in certain embodiments, may be conducted (e.g., by a word line 108, a bit line 106, 252, and/or another electrical line) to a selector 258 for a memory cell 254 for the operation. The selector 258 may have a threshold (e.g., a threshold voltage, a threshold current, or the like), above which the selector 258 activates, turns on, and/or becomes conductive (e.g., "pops"), conducting the electrical pulse to the memory cell 254. As used herein, a selector 258 is active, activated, on, or the like while the selector 258 is electrically conductive and is passive and/or off while the selector 258 is not electrically conductive. Popping a selector 258, as used herein, comprises transitioning the selector 258 from a nonconductive to a conductive state (e.g., causing the selector 258 to release a pop and/or spike of current in response to becoming conductive, or the like). In this manner, a selector 258 connected in series with a memory cell 254 may inhibit parasitic leakage through the memory cell 254 when the memory cell 254 is not selected, while allowing reset, set, and/or read currents to reach the memory cell 254 when the memory cell 254 is selected for a memory operation.

In response to a current and/or voltage of an electrical pulse applied to a selector 258 satisfying a threshold for the selector 258, activating and/or turning on the selector 258, the selector 258 may "pop," causing an electrical spike of current and/or voltage (e.g., conducted to the memory cell 254, the word line 108, and/or the bit line 106, 252) which may be detectable by the control circuit 502, as described below with regard to the detection circuit 504, or the like. For example, the control circuit 502 may use the detection circuit 504 to detect that an electrical pulse (e.g., a voltage and/or current) has crossed an electrical spike threshold in one direction then again in an opposite direction, indicating an electrical pop or spike in the electrical pulse.

In response to detecting an electrical pop and/or spike in an electrical pulse (e.g., a voltage and/or current of the electrical pulse crossing an electrical spike threshold in one direction (rising or falling) and again in an opposite direction (rising or falling)), in some embodiments, the control circuit 502 may use the may be configured to maintain at least an operational level for the same electrical pulse for at least a predefined time period to perform an operation on the memory cell 254. In this manner, the control circuit 502 may use the same pop current to substantially immediately perform a memory operation on the associated memory cell 254, instead of delaying the operation by letting the electrical pulse fall below an operational level and sending a second electrical pulse to perform the operation.

An operational level, as used herein, comprises an amount of electrical current and/or voltage selected to perform an operation, or a portion thereof. For example, a PCM memory cell 254 may have an operational level comprising a reset current threshold for resetting the memory cell 254 to a reset amorphous state, an operational level comprising a set current threshold for setting the memory cell 254 to a set crystalline state, an operational level comprising a read current for sensing a state of the memory cell 254, or the like. An operational level may be defined in terms of voltage, current, both voltage and current, a temperature, or the like.

A memory operation may be associated with an operational level for an electrical pulse, as well as a predefined time period to perform the operation. For example, in some embodiments, a reset operation for a PCM memory cell 254 may have a shorter predefined time period than a set operation, or the like. In response to the detection circuit 504 detecting an electrical pop and/or spike (e.g., a second crossing of an electrical spike threshold), the control circuit 502 may set a timer 506 for the predefined time period associated with the memory operation (e.g., a reset time period during which the memory cell 254 reaches an amorphous state under the operational level for the electrical pulse, a set time period during which the memory cell 254 reaches a crystalline state under the operational level for the electrical pulse, a read time period during which a state of the memory cell 254 is sensed, or the like), and may maintain the same electrical pulse at the operational level for at least the duration of the timer, to perform the associated operation. Starting a timer for an operation in response to detection of a pop or spike of a selector 258, in some embodiments, maximizes the speed at which the operation may be performed, with little or no delay between activating the selector 258 and performing the operation on the associated memory cell 254.

In one embodiment, a memory cell 254 comprises a phase change memory (PCM) cell 254, the selector 258 comprises an ovonic threshold switching (OTS) selector 258, the operation comprises a reset operation for the memory cell 254, and the predefined time period for which the control circuit 502 sets the timer 506 comprises a time for the memory cell 254 to reach an amorphous state in response to the electrical pulse. In this manner, in certain embodiments, an on-die controller 114 may be configured to supply a reset current to one of the electrical lines associated with at least one of the phase change memory cells 254 (e.g., a word line 108, a bit line 106, 252) and the supplied reset current may activate at least one of the OTS selectors 258 and reset the at least one phase change memory cell 254 to a reset amorphous state without the reset current falling below a reset current threshold (e.g., the operational level for the reset operation).

In a further embodiment, the operation may comprise a set operation for the memory cell 254 and the predefined time period may comprise a time for the memory cell 254 to reach a crystalline state in response to the electrical pulse, the operation may comprise a read operation for the memory cell 254 and the predefined time period may comprise a time for a state of the memory cell 254 to be sensed, or the like. For embodiments where the memory cells 254 comprise ReRAM, MRAM, CBRAM, NAND memory, and/or another type of memory, the control circuit 502 may perform other types of operations, with other operational levels (e.g., program operations, erase operations, read operations, or the like).

In one embodiment, the timer 506 comprises a resistive and/or capacitive delay circuit comprising one or more buffers and/or one or more capacitors, or the like, selected and sized to delay a signal for the predefined time period for an operation. For example, in certain embodiments, the timer 506 may comprise an 'AND' logic gate configured to indicate to the control circuit 502 that the predefined time period for an operation is complete in response to a detection signal indicating that the detection circuit 504 has detected the crossing of an electrical spike threshold by the electrical pulse in the opposite direction (e.g., the second crossing) and a delayed copy of the detection signal from an output of the resistive and capacitive delay circuit of the timer 506, as described in greater detail below with regard to FIG. 10. In other embodiments, the control circuit 502 may use one or more other types of timers 506, different timers for different types of operations, a configurable timer adjustable to time different predefined time periods for different types of operations, or the like.

In one embodiment, the detection circuit 504 is configured to detect a spike and/or pop in an electrical pulse. For example, the detection circuit 504 may monitor and/or measure a voltage and/or a current on a word line 108 and/or a bit line 106, 252 for a memory cell 254 to detect a spike and/or pop in the voltage and/or current, indicating that the selector 258 has popped, been activated, turned on, or the like. As described above, in certain embodiments, the control circuit 502 is configured to set a timer 506 for a predefined time period of an operation in response to the detection circuit 504 detecting the spike and/or pop. For example, the on-die controller 114 may use the detection circuit 504 to detect a spike and/or pop in a current and/or a voltage of a reset current, a set current, a read current, and/or another electrical pulse in response to the reset current, set current, read current, and/or other electrical pulse activating at least one selector 258 (e.g., an OTS selector 258), and the control circuit 502 may set the timer 506 in response to the detection circuit 504 detecting the spike and/or pop.

A detection circuit 504, in one embodiment, is configured to detect an electrical spike and/or pop by detecting two crossings of an electrical spike threshold by an electrical pulse (e.g., a first crossing of an electrical spike threshold by the electrical pulse in a first direction and a second crossing of an electrical spike threshold by the electrical pulse in an opposite direction from the first direction, crossing up then down, crossing down then up, or the like). In one embodiment, an electrical spike threshold may comprise a current threshold relative to a measured current of an electrical pulse. An electrical spike threshold, in a further embodiment, may comprise a voltage threshold relative to a measured voltage of an electrical pulse.

An electrical spike threshold, in some embodiments, is set to have a greater magnitude than an operational level for the associated operation (e.g., at or higher than the operational level for a positive threshold and/or operational level, at or below the operational level for a negative threshold and/or operational level, or the like), so that the control circuit 502 may maintain the electrical pulse with a magnitude at or greater than the operational level for at least a predefined period. An electrical spike threshold with a magnitude at or greater than an operational level allows the spike and/or pop current and/or voltage, in certain embodiments, to comprise part of the operation on the memory cell 254, as the voltage and/or current of the electrical pulse during the spike and/or pop satisfies the operational level and the control circuit 502 maintains the electrical pulse for at least a predefined time period.

As described in greater detail below with regard to FIGS. 8A, 8B, 8C, and 8D, in some embodiments, the detection circuit 504 may comprise one or more current mirror stacks 508 configured to detect an electrical spike and/or pop. For example, in one embodiment, a first current mirror stack 508 may detect the crossing of an electrical spike threshold by an electrical pulse in a first direction based on a bias voltage and a threshold voltage of a transistor of the first current mirror stack 508, a second current mirror stack 508 may maintain a current for the electrical pulse while the first and/or third current mirror stacks detect the crossing of an electrical spike threshold by the electrical pulse in the first and/or opposite directions, a third current mirror stack 508 may detect the crossing of an electrical spike threshold by the electrical pulse in the opposite direction based on the bias voltage and a threshold voltage of a transistor of the third current mirror stack 508, and/or a fourth current mirror stack 508 may maintain a second current for at least a predefined time period in response to the third current mirror stack 508 detecting the crossing in the opposite direction, or the like.

Figure 6:
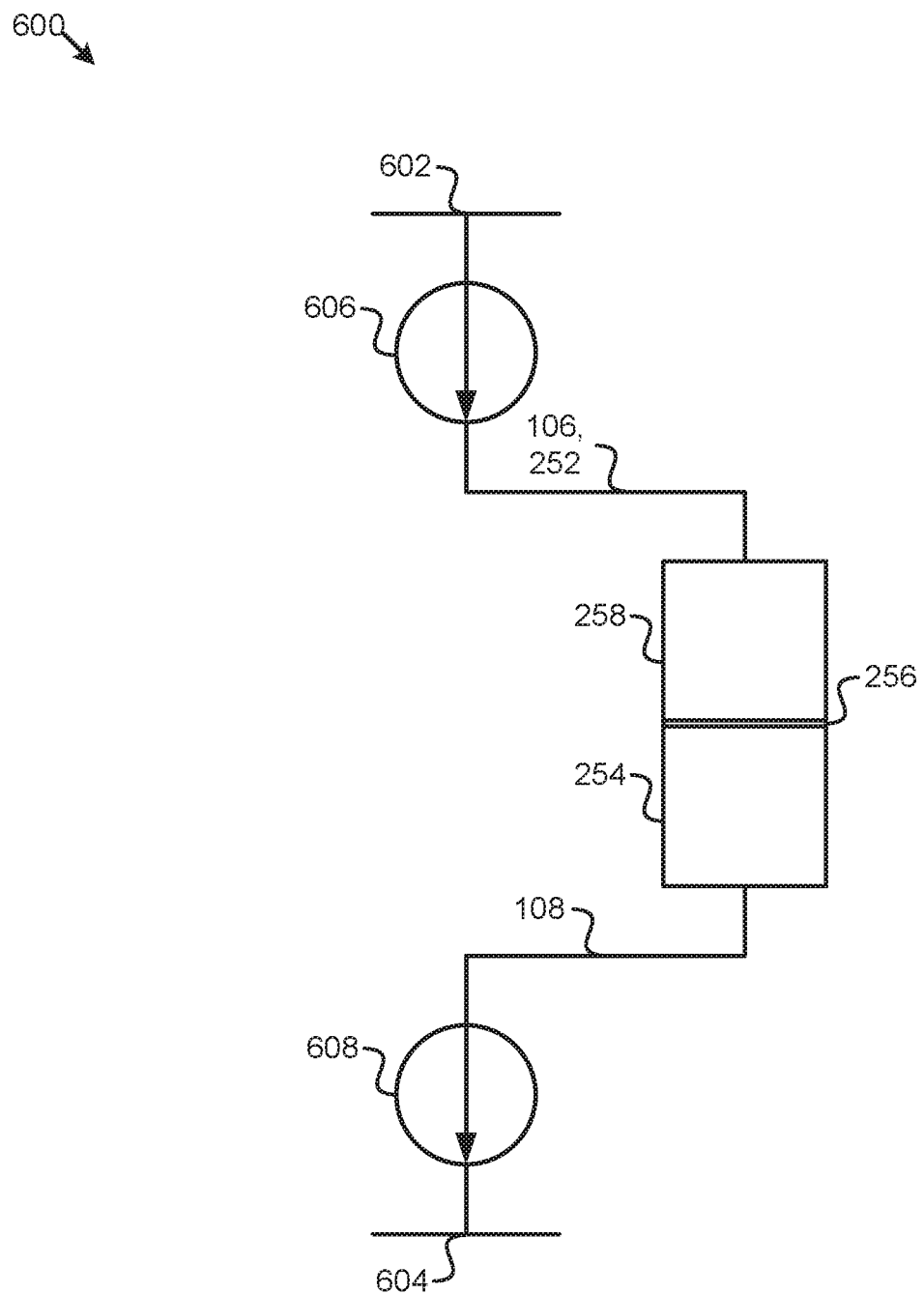
FIG. 6 is a schematic block diagram illustrating one embodiment of a system for a single pulse memory operation.

FIG. 6 depicts one embodiment of a system 600 for a single pulse memory operation. The system 600, in the depicted embodiment, includes a bit line electrical source 602 that provides a bit line current 606 to a bit line 106, 252 for a selector 258 and a memory cell 254, with a separation layer 256 therebetween, and a word line electrical source 604 that provides a word line current 608 to a word line 108 for the memory cell 254. In other embodiments, the selector 258 and the memory cell 254 may be flipped, as described above, with the word line 108 coupled to the selector 258 and the bit line 106, 252 coupled to the memory cell 254, or the like.

In various embodiments, the bit line electrical source 602 may comprise a bit line driver, a sense amplifier, a charge pump, a voltage supply, a current source, a power supply, or the like, configured to generate (e.g., source or sink) an electric pulse onto a bit line 106, 252, to provide a bit line current 606 or the like for the selector 258 and/or the memory cell 254. Similarly, in certain embodiments, the word line electrical source 604 may comprise a word line driver, a charge pump, a voltage supply, a current source, a power supply, or the like, configured to generate (e.g., source or sink) an electric pulse onto a word line 108, to provide a word line current 608 or the like for the memory cell 254 and/or the selector 258. For example, the bit line electrical source 602 and the word line electrical source 604 may bias opposite sides of the selector 258 and the memory cell 254, providing an electrical pulse to activate the selector 258 and to perform one or more operations on the memory cell 254, using a single electrical pulse, without the electrical pulse falling below an operational level for the operation.

Figure 7:
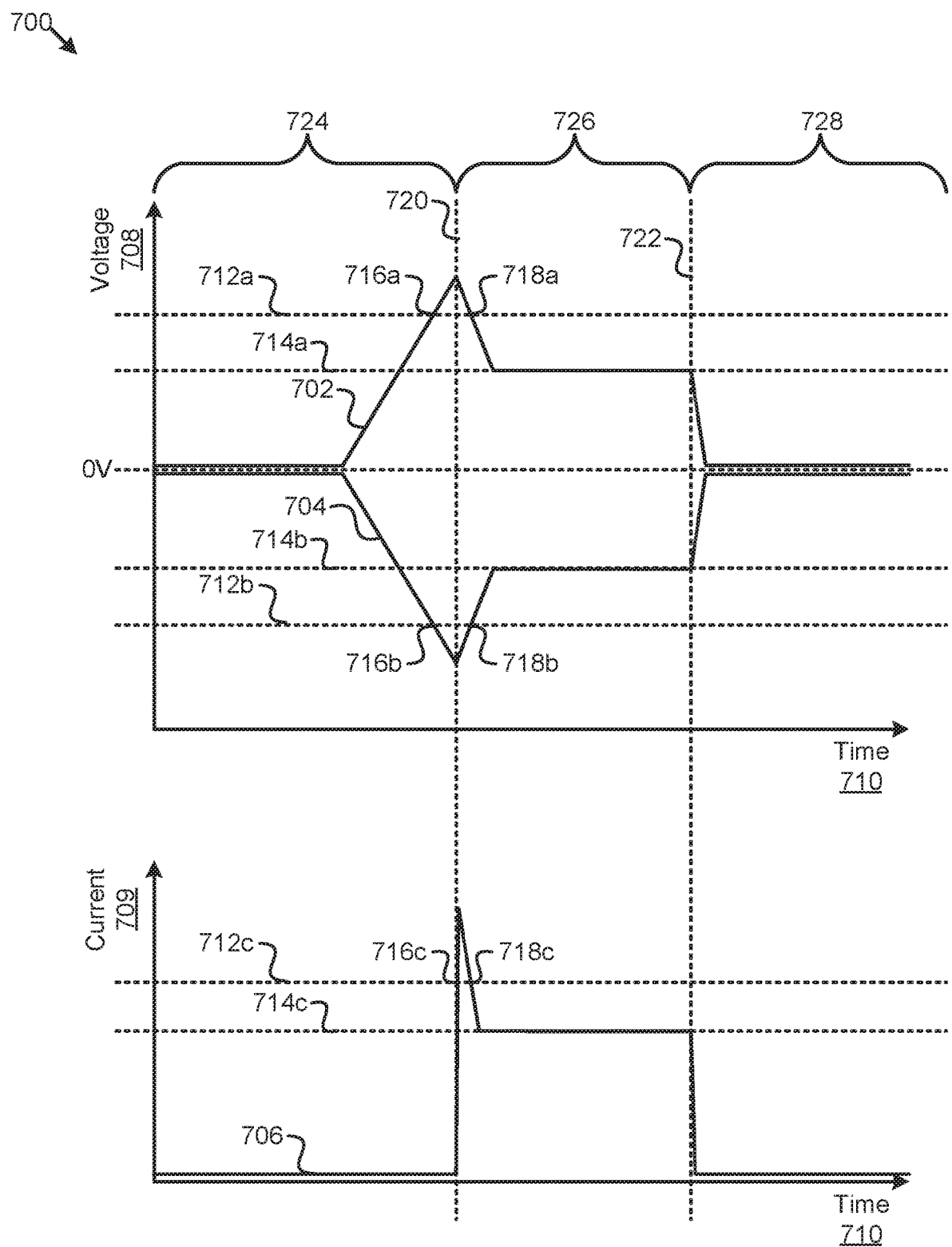
FIG. 7 is a graph illustrating one embodiment of a single pulse memory operation.

FIG. 7 is a graph 700 depicting one embodiment of a single pulse memory operation. The graph 700 illustrates a bit line voltage 702 on a bit line 106, 252 for a memory cell 254, a word line voltage 704 on a word line 108 for the memory cell 254, and a cell current 706 for the memory cell 254, plotted by voltage 708 and current 709 over time 710 during a single pulse memory operation.

During a charging period 724, in some embodiments, the control circuit 502 of the on-die controller 114 begins an operation on a memory cell 254 (e.g., in response to a read request and/or a write request from a storage client, as a background and/or maintenance operation performed by the on-die controller 114, or the like), and uses a bit line electrical source 602 and/or a word line electrical source 604 to generate an electrical pulse to charge a bit line 106, 252 and/or a word line 108, in order to both reach a threshold current and/or voltage to activate a selector 258, and to reach and maintain an operational level 714 for the operation.

In order to detect an electrical spike 720 and/or pop 720 in the electrical pulse, indicating that the selector 258 is activated and/or on, in certain embodiments, the on-die controller 114 uses the detection circuit 504 (e.g., one or more current mirror stacks 508, or the like) to measure and/or monitor one or more of the bit line voltage 702, the word line voltage 704, and/or the cell current 706, to detect a first crossing 716*a-c* of an electrical spike threshold 712*a-c*. For example, in one embodiment, the detection circuit 504 may monitor the bit line voltage 702 on a bit line 106, 252 and detect a first crossing 716*a* of an electrical spike voltage threshold 712*a* (e.g., the bit line voltage 702 exceeding the electrical spike voltage threshold 712*a*). In a further embodiment, the detection circuit 504 may monitor the word line voltage 704 on a word line 108 and detect a first crossing 716*b* of an electrical spike voltage threshold 712*b* (e.g., the word line voltage 704 falling below the electrical spike voltage threshold 712*a*). In another embodiment, the detection circuit 504 may monitor the cell current 706 on a word line 108 and/or bit line 106, 252 and detect a first crossing 716*c* of an electrical spike current threshold 712*c* (e.g., the cell current 706 exceeding the electrical spike voltage threshold 712*a*).

In response to detecting a first crossing 716*a-c* of an electrical spike threshold 712*a-c*, the on-die controller 114 uses the detection circuit 504 (e.g., one or more different mirror stacks 508, or the like) to detect a second crossing 718*a-c* of an electrical spike threshold 712*a-c* in an opposite direction as the first crossing 716*a-c*, indicating that the selector 258 is active/on and the monitored bit line voltage 702, word line voltage 704, and/or cell current 706 has reached a peak of the resulting spike 720 and/or pop 720.

In response to detecting the second crossing 718*a-c* in the opposite direction, the on-die controller 114, during a soaking period 726 or the like (e.g., a predefined period of time to perform an operation), the on-die controller 114 may set a timer 506 to maintain the electrical pulse with a magnitude of at least an operational level 714*a-c*. For example, for a PCM reset operation, in some embodiments, the operational current level for the cell current 706 may be at least about 100 microamps, and the predefined soaking time period 726 may comprise a few nanoseconds, or the like.

In response to the timer 506 indicating the predefined soaking time period 726 has ended, the control circuit 502 of the on-die controller 114 may end the electrical pulse, triggering a disconnecting period 728. For example, the control circuit 502 may turn off, adjust an output of, and/or disconnect a word line power source 604 and/or a bit line power source 602 to end the electrical pulse, allowing the selector 258 to turn off such that it is no longer conductive, thereby ending the operation on the memory cell 254, or the like.

Figure 8A:
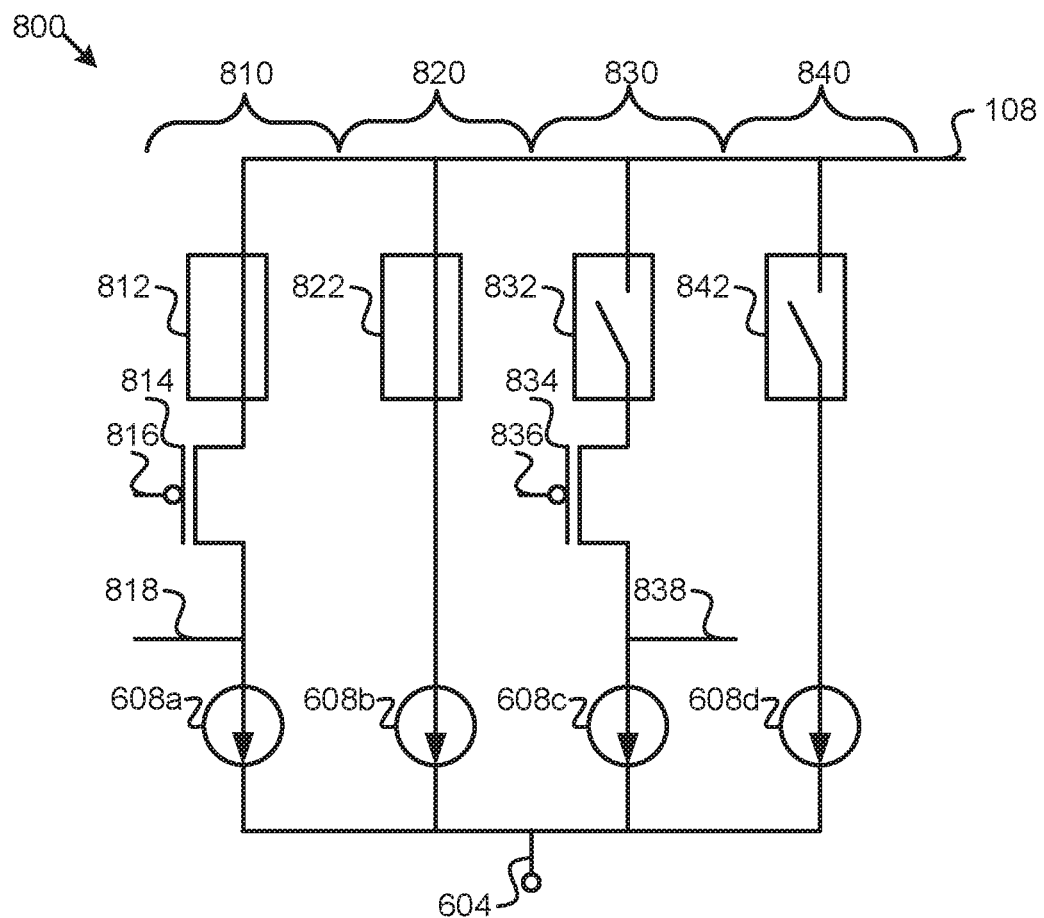
FIG. 8A is a schematic block diagram illustrating one embodiment of a system for a single pulse memory operation.

FIG. 8A depicts one embodiment of a system 800 for a single pulse memory operation. The system 800, in the depicted embodiment, includes a plurality of current mirrors 810, 820, 830, 840 in a locked phase. The current mirrors 810, 820, 830, 840, in some embodiments, may be substantially similar to the current mirror stack 508 described above with regard to FIG. 5.

In one embodiment, a switch 812 of the first current mirror 810 and a switch 822 of the second current mirror 820 are closed during the locked phase, so that the first current mirror 810 and the second current mirror 820 receive the word line current 608 from the word line 108. A PMOS transistor 814 of the first current mirror 810 receives a bias voltage 816. In certain embodiments, the bias voltage 816 is selected so that a sum of the bias voltage 816 and a threshold voltage of the PMOS transistor 814 is equal to the electrical spike threshold 712b, so that in response to the word line voltage 704 falling below the electrical spike threshold 712b, the PMOS transistor 814 turns off, causing the lock/unlock signal 818 to go low, opening the switch 812 of the first current mirror 810 for the detection phase described below with regard to FIG. 8B. In this manner, the first current mirror 810 is configured to detect the crossing of the electrical spike threshold 712b by the electrical pulse based on the bias voltage 816 and the threshold voltage of the PMOS transistor 814.

Figure 8B:
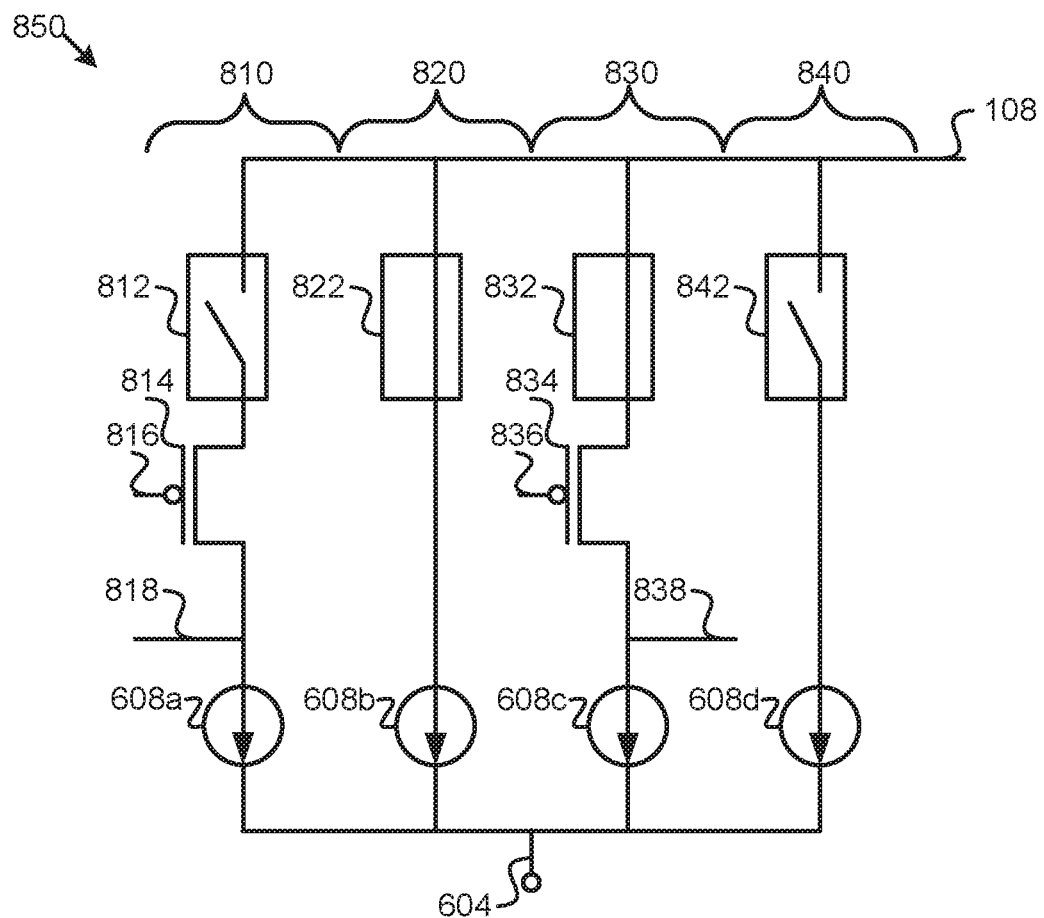
FIG. 8B is a schematic block diagram illustrating a further embodiment of a system for a single pulse memory operation.

In one embodiment, the switch 822 of the second current mirror 820 being closed during the locked phase allows the second current mirror 820 to maintain enough current 608b to pull on the word line 108 (e.g., sinking current to the word line electrical source 604 or the like) until the first current mirror 810 detects the crossing of the electrical spike threshold 712b by the electrical pulse (e.g., by the word line voltage 704), and afterward while the third current mirror 830 detects a second crossing as described below with regard to FIG. 8B. In the depicted embodiment, a switch 832 of the third current mirror 830 and a switch 842 of the fourth current mirror 840 are open during the locked phase.

FIG. 8B depicts one embodiment of a system 850 for a single pulse memory operation. The system 850, in the depicted embodiment, includes a plurality of current mirrors 810, 820, 830, 840 operating in a detection phase. The current mirrors 810, 820, 830, 840, in certain embodiments, may be substantially similar to the current mirrors 810, 820, 830, 840 of FIG. 8A, but in a detection phase of the single pulse memory operation. The current mirrors 810, 820, 830, 840, in some embodiments, may be substantially similar to the current mirror stack 508 described above with regard to FIG. 5.

In the detection phase, in certain embodiments, the second current mirror 820, with the switch 822 closed, continues maintaining enough current to pull down the voltage of the word line 108 in response to the first current mirror 810 detecting the crossing of the electrical spike threshold 712b, while the third current mirror 830 detects a second crossing of the electrical spike threshold 712b in an opposite direction. The switch 832 of the third current mirror 830, in the detection phase, is closed, so that the third current mirror 830 and the second current mirror 820 both receive the word line current 608 from the word line 108. A PMOS transistor 834 of the third current mirror 830 receives a bias voltage 836, which may be similar to the bias voltage 816 if the electrical spike threshold 712 for detecting the second crossing is the same as the electrical spike threshold 712 used to detect the first crossing.

Figure 8C:
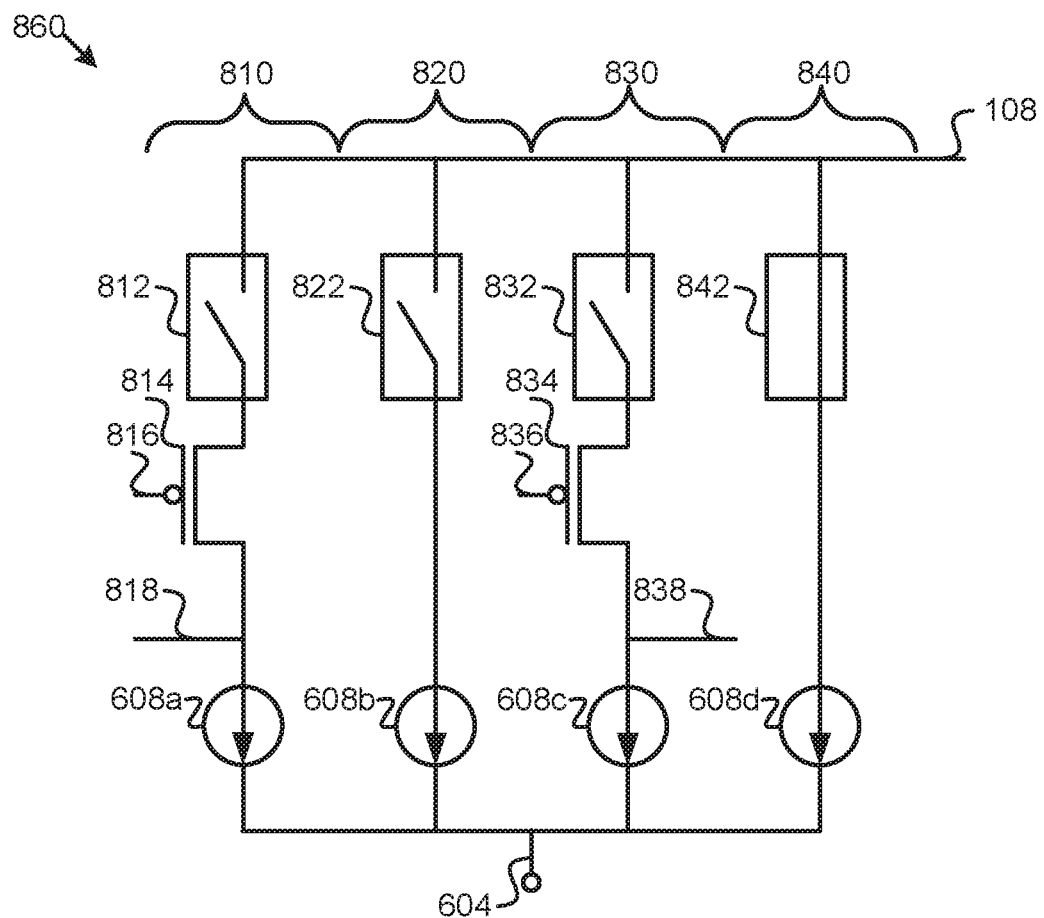
FIG. 8C is a schematic block diagram illustrating a certain embodiment of a system for a single pulse memory operation.

In certain embodiments, the bias voltage 836 is selected so that a sum of the bias voltage 836 and a threshold voltage of the PMOS transistor 834 is equal to the electrical spike threshold 712b selected to detect the second crossing, so that in response to the word line voltage 704 exceeding the electrical spike threshold 712b, the PMOS transistor 834 turns on, causing the detection signal 838 to go high, opening the switch 832 of the third current mirror 830 and closing the switch 842 of the fourth current mirror 840 for the soaking phase described below with regard to FIG. 8C, and starting the timer 506 for the soaking phase. In this manner, the third current mirror 830 is configured to detect a second crossing of the electrical spike threshold 712b by the electrical pulse in an opposite direction of the first crossing based on the bias voltage 836 and a threshold voltage of the PMOS transistor 834 of the third current mirror 830.

FIG. 8C depicts one embodiment of a system 860 for a single pulse memory operation. The system 860, in the depicted embodiment, includes a plurality of current mirrors 810, 820, 830, 840 operating in a soaking phase. The current mirrors 810, 820, 830, 840, in certain embodiments, may be substantially similar to the current mirrors 810, 820, 830, 840 of FIG. 8A and/or of FIG. 8B, but in a soaking phase of the single pulse memory operation. The current mirrors 810, 820, 830, 840, in some embodiments, may be substantially similar to the current mirror stack 508 described above with regard to FIG. 5.

As described above, in certain embodiments, the switch 842 of the fourth current mirror 840 closes in response to the third current mirror 830 detecting the second crossing of the electrical spike threshold 712b by the electrical pulse. With the switch 842 of the fourth current mirror 840 closed, the fourth current mirror 840 is configured to maintain an electrical current sufficient to maintain the electrical pulse at the operational level 714 for at least the predefined time period for the single pulse memory operation (e.g., until the timer 506 indicates that the predefined time period is complete, opening the switch 842 as described below with regard to FIG. 8D).

Figure 8D:
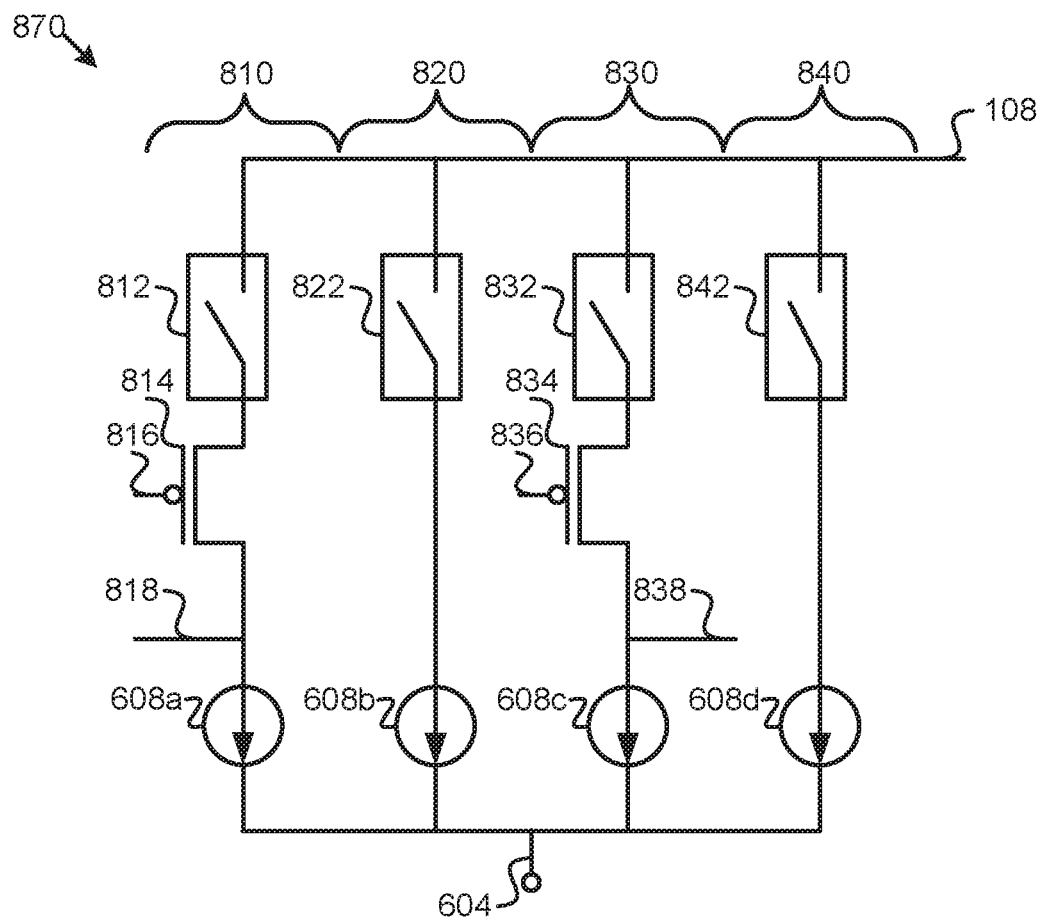
FIG. 8D is a schematic block diagram illustrating another embodiment of a system for a single pulse memory operation.

FIG. 8D depicts one embodiment of a system 870 for a single pulse memory operation. The system 870, in the depicted embodiment, includes a plurality of current mirrors 810, 820, 830, 840 operating in a disconnect phase, between operations or the like. The current mirrors 810, 820, 830, 840, in certain embodiments, may be substantially similar to the current mirrors 810, 820, 830, 840 of FIG. 8A, of FIG. 8B, and/or of FIG. 8C, but in a disconnect phase. The current mirrors 810, 820, 830, 840, in some embodiments, may be substantially similar to the current mirror stack 508 described above with regard to FIG. 5.

In response to the timer 506 indicating that the predefined time period for the single pulse memory operation (e.g., the soaking phase described above with regard to FIG. 8C) is complete, the control circuit 502 opens the switch 842 of the fourth current mirror 840, so that each of the plurality of current mirrors 810, 820, 830, 840 are disconnected, and the selector 258 turns off. For example, as described below with regard to the timer 1000 of FIG. 10, a timer 506, 1000 may provide a disconnect signal 1010, and the control circuit 502 may disconnect the switch 842 in response to the disconnect signal 1010. In response to a subsequent operation, the control circuit 502 may close the switches 812, 822 of the first and second current mirrors 810, 820 for a subsequent locked phase as described above with regard to FIG. 8A to pop the selector 258 for the subsequent operation.

Figure 9:
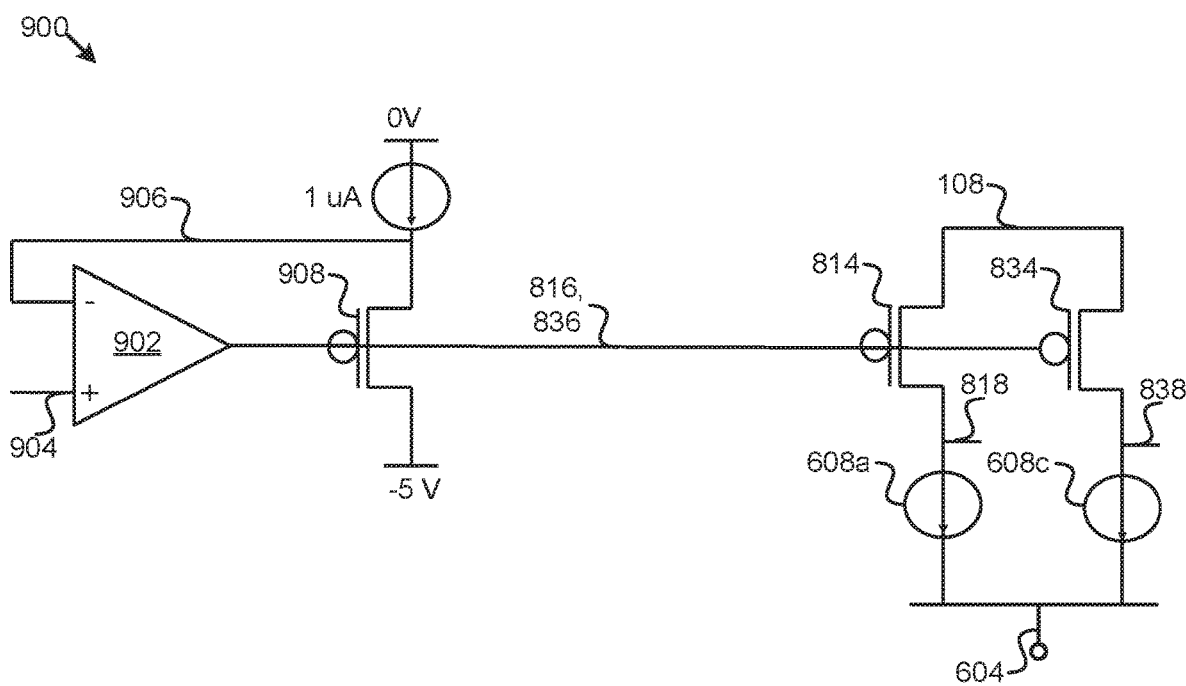
FIG. 9 is a schematic block diagram illustrating one embodiment of a system for generating a threshold bias.

FIG. 9 depicts one embodiment of a system 900 for generating a threshold bias 816, 836. In the depicted embodiment, an amplifier 902 receives a threshold input 904 and a feedback input 906 from a PMOS transistor 908 at the output of the amplifier 902. In certain embodiments, the PMOS transistor 908 may be substantially similar to the PMOS transistors 814, 834 of the current mirrors 810, 830 described above with regard to FIGS. 8A-8C, with the same threshold voltage, and the threshold input 904 is set at the target electrical spike voltage threshold 712, so that the generated threshold bias 816, 836 is equal to the electrical spike voltage threshold 712 minus the threshold voltage of the PMOS transistor 908. The 0V and −5V voltages and 1 microamp current depicted in FIG. 9 for biasing the PMOS transistor 908 are included by way of example only, and other voltages and currents may be used in other embodiments.

Figure 10:
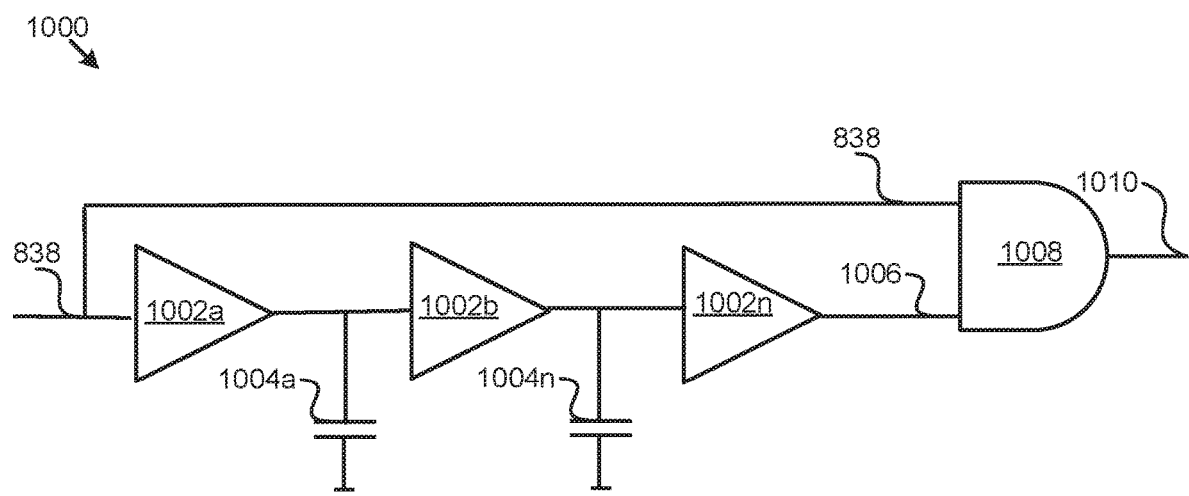
FIG. 10 is a schematic block diagram illustrating one embodiment of a timer.

FIG. 10 depicts one embodiment of a timer 1000. The timer 1000, in certain embodiments, may be substantially similar to the timer 506 described above with regard to FIG. 5.

In the depicted embodiment, the timer 1000 comprises a resistive and capacitive delay circuit, with a series of one or more buffers 1002a-n and one or more capacitors 1004a-n. The one or more buffers 1002a-n and the one or more capacitors 1004a-n, in certain embodiments, are selected and configured to delay the detection signal 838, provided as input for the timer 1000, for a predefined period of time (e.g., for the soaking period 726, for a duration of the soaking phase described above with regard to FIG. 8C, or the like).

The timer 1000, in the depicted embodiment, includes an 'AND' logic gate which receives the detection signal 838 and the delayed detection signal 1006 as inputs, and provides a disconnect signal 1010 as an output. In this manner, in some embodiments, the disconnect signal 1010 goes high when both the detection signal 838 and the delayed detection signal 838 are high, after the predefined period of time is complete, so that the disconnect signal 1010 indicates to the control circuit 502 to disconnect the switch 842 of the fourth current mirror 840, to end the electrical pulse and the associated operation.

Figure 11:
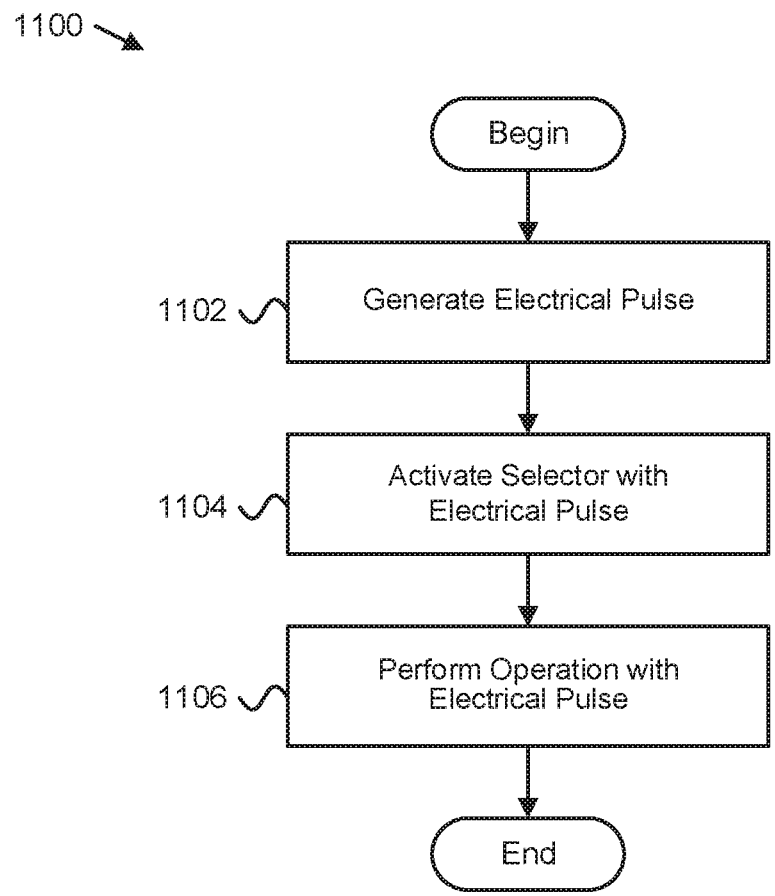
FIG. 11 is a schematic flow chart diagram illustrating one embodiment of a method for a single pulse memory operation.

FIG. 11 depicts one embodiment of a method 1100 for a single pulse memory operation. The method 1100 begins and an electrical source 602, 604 generates 1102 an electrical pulse to activate 1104 a selector 258 for a memory cell 254, so that the selector 258 conducts the electrical pulse from the electrical source 602, 604 to the memory cell 254. A control circuit 502 performs 1106 an operation on the memory cell 254 using the same generated 1102 electrical pulse (e.g., without letting the electrical pulse fall below an operational level for at least a predefined period of time) and the method 1100 ends.

Figure 12:
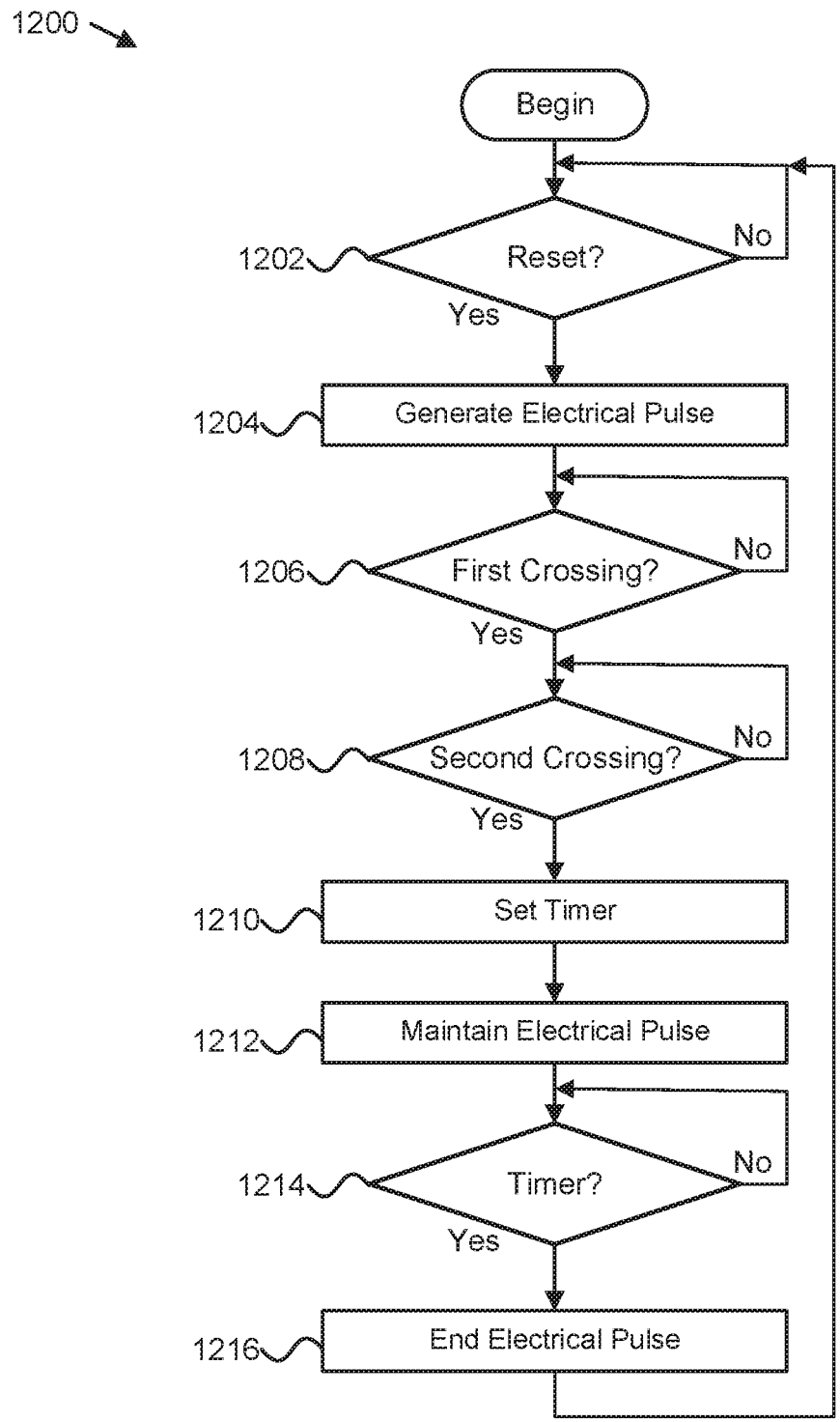
FIG. 12 is a schematic flow chart diagram illustrating a further embodiment of a method for a single pulse memory operation.

FIG. 12 depicts one embodiment of a method 1200 for a single pulse reset operation. The method 1200 begins and a control circuit 502 of an on-die controller 114 determines 1202 whether to perform a reset operation on a memory cell 254 (e.g., in response to a request from a storage client, in response to a scheduled maintenance operation, or the like). If the control circuit 502 determines 1202 to perform a reset operation on the memory cell 254, the control circuit 502 uses an electrical source 602, 604 to generate 1204 an electrical pulse.

The detection circuit 504, using a first current mirror 810 of a current mirror stack 508, or the like, detects 1206 a first crossing of an electrical spike threshold 712 by the generated 1204 electrical pulse. In response to the detection circuit 504 detecting 1206 the first crossing of an electrical spike threshold 712, the detection circuit 504, using a third current mirror 830 of the current mirror stack 508, or the like, detects 1208 a second crossing of an electrical spike threshold 712 in an opposite direction from the direction of the first detected 1206 crossing.

In response to the detection circuit 504 detecting 1208 the second crossing of an electrical spike threshold 712, the control circuit 502 sets a timer 506, 1000 for a predefined soaking time period for the reset operation and the control circuit 502 uses the electrical source 602, 604 to maintain 1212 the electrical source until the timer 506, 1000 determines 1214 that the predefined soaking time period is complete. In response to the timer 506, 1000 determining 1214 that the predefined soaking time period is complete, the control circuit 502 ends 1216 the electrical pulse, by opening a switch 842 of the fourth current mirror 840 or the like. The method 1200 continues for subsequent operations.

A means for popping a memory cell selector 258 with an operation current so that the selector 258 becomes conductive, in various embodiments, may include an on-die controller 114, a control circuit 502, a state machine 222, an electrical pulse, read/write circuits 230, an electrical source, a word line driver, a bit line driver, a sense amplifier 250, a charge pump, a voltage supply, a current source, a power supply, a word line 108, a bit line 106, 252, a bit line electrical source 602, a word line electrical source 604, a bit line current 606, a word line current 608, a bit line voltage 702, a word line voltage 704, a first current mirror 810, a second current mirror 820, a third current mirror 830, a processor, a device driver, other logic hardware, and/or other executable code stored on a computer readable storage medium. Other embodiments may include similar or equivalent means for popping a memory cell selector 258 with an operation current so that the selector 258 becomes conductive.

A means for setting a timer 506, 1000 in response to a memory cell selector 258 popping, in various embodiments, may include an on-die controller 114, a control circuit 502, a state machine 222, a third current mirror 830, a transistor 834, a detection signal 838, a processor, a device driver, other logic hardware, and/or other executable code stored on a computer readable storage medium. Other embodiments may include similar or equivalent means for setting a timer 506, 1000 in response to a memory cell selector 258 popping.

A means for supplying an operation current for at least a predefined time period based on a timer 506, 1000 to perform an operation on a memory cell 254 with the operation current, in various embodiments, may include an on-die controller 114, a control circuit 502, a state machine 222, an electrical pulse, read/write circuits 230, an electrical source, a word line driver, a bit line driver, a sense amplifier 250, a charge pump, a voltage supply, a current source, a power supply, a word line 108, a bit line 106, 252, a bit line electrical source 602, a word line electrical source 604, a bit line current 606, a word line current 608, a bit line voltage 702, a word line voltage 704, a second current mirror 820, a third current mirror 830, a fourth current mirror 840, a processor, a device driver, other logic hardware, and/or other executable code stored on a computer readable storage medium. Other embodiments may include similar or equivalent means for supplying an operation current for at least a predefined time period based on a timer 506, 1000 to perform an operation on a memory cell 254 with the operation current.

A means for detecting a memory cell selector 258 popping by detecting a first crossing of an electrical spike threshold 712 by an electrical pulse and a second crossing of an electrical spike threshold 712 by the electrical pulse, in various embodiments, may include an on-die controller 114, a control circuit 502, a detection circuit 504, a current mirror stack 508, a state machine 222, a first current mirror 810, a second current mirror 820, a third current mirror 830, a processor, a device driver, other logic hardware, and/or other executable code stored on a computer readable storage medium. Other embodiments may include similar or equivalent means for detecting a memory cell selector 258 popping by detecting a first crossing of an electrical spike threshold 712 by an electrical pulse and a second crossing of an electrical spike threshold 712 by the electrical pulse.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a bit line;
   a word line;
   a memory cell connected between the bit line the word line;
   one or more electrical sources configured to generate and apply an electrical pulse to the word line and the bit line;
   a selector connected in series with the memory cell between the bit line and the word line, the selector configured to conduct the electrical pulse from the one or more electrical sources to the memory cell in response to the electrical pulse exceeding a threshold; and
   a control circuit connected to the one or more electrical sources and configured to control the one or more electrical sources to provide an initial spike for the pulse and subsequently maintain at least an operational level for the electrical pulse for a predefined time period to perform an operation on the memory cell.

2. The apparatus of claim 1, further comprising a detection circuit configured to detect the spike in the electrical pulse, the control circuit configured to set a timer for the predefined time period in response to the detection circuit detecting the spike.

3. The apparatus of claim 2, wherein the detection circuit is configured to detect the spike by:
   detecting a crossing of an electrical spike threshold by the electrical pulse in a first direction; and
   detecting a crossing of an electrical spike threshold by the electrical pulse in an opposite direction from the first direction.

4. The apparatus of claim 3, wherein the control circuit is configured to set the timer for the predefined time period in response to the detection circuit detecting the crossing of an electrical spike threshold by the electrical pulse in the opposite direction.

5. The apparatus of claim 3, wherein an electrical spike threshold comprises a current threshold relative to a measured current of the electrical pulse.

6. The apparatus of claim 3, wherein an electrical spike threshold comprises a voltage threshold relative to a measured voltage of the electrical pulse.

7. The apparatus of claim 3, wherein the detection circuit comprises a current mirror stack.

8. The apparatus of claim 7, wherein a first current mirror of the current mirror stack is configured to detect the crossing of an electrical spike threshold by the electrical pulse in the first direction based on a bias voltage and a threshold voltage of a transistor of the first current mirror.

9. The apparatus of claim 8, wherein a second current mirror of the current mirror stack is configured to maintain a current until the crossing of an electrical spike threshold by the electrical pulse in the first direction is detected.

10. The apparatus of claim 9, wherein a third current mirror of the current mirror stack is configured to detect the crossing of an electrical spike threshold by the electrical pulse in the opposite direction based on the bias voltage and a threshold voltage of a transistor of the third current mirror.

11. The apparatus of claim 10, wherein a fourth current mirror of the current mirror stack is configured to maintain a second current for at least the predefined time period from the control circuit in response to the third current mirror detecting the crossing of an electrical spike threshold by the electrical pulse in the opposite direction.

12. The apparatus of claim 3, wherein the timer comprises a resistive and capacitive delay circuit comprising one or more buffers and one or more capacitors.

13. The apparatus of claim 12, wherein the timer comprises an 'AND' logic gate configured to indicate that the predefined time period is complete in response to a detection signal indicating that the detection circuit has detected the crossing of an electrical spike threshold by the electrical pulse in the opposite direction and a delayed copy of the detection signal from an output of the resistive and capacitive delay circuit.

14. The apparatus of claim 1, wherein the memory cell comprises a phase change memory cell, the selector comprises an ovonic threshold switching (OTS) selector, the operation comprises a reset operation for the memory cell, and the predefined time period comprises a time for the memory cell to reach an amorphous state in response to the electrical pulse.

15. A system comprising:
   an array comprising a plurality of phase change memory cells each having a reset amorphous state and a set crystalline state;
   a plurality of ovonic threshold switching (OTS) selectors, each of the OTS selectors positioned between a corresponding one of the phase change memory cells and electrical lines of the array; and
   an on-die controller configured to supply a reset current to one of the electrical lines associated with at least one of the phase change memory cells, the reset current including an initial spike activating at least one of the OTS selectors and resetting at least one of the phase change memory cells to the reset amorphous state without the reset current falling below a reset current threshold.

16. The system of claim 15, wherein the on-die controller comprises a control circuit that sets a timer for the on-die controller to maintain the reset current for at least a predefined time period.

17. The system of claim 16, wherein the on-die controller further comprises a detection circuit configured to detect the spike in one or more of a current and a voltage of the reset current in response to the reset current activating the at least one of the OTS selectors, the control circuit setting the timer in response to the detection circuit detecting the spike.

18. The system of claim 17, wherein the detection circuit is configured to detect the spike by:
   detecting a first crossing of an electrical spike threshold by the electrical current; and
   detecting a second crossing of the electrical spike threshold by the electrical current, the control circuit setting the timer in response to the detection circuit detecting the second crossing of the electrical spike threshold by the electrical current.

19. An apparatus comprising:
   a bit line;
   a word line;
   a memory cell connected between the bit line and word line;
   a memory cell selector connected in series with the memory cell between the bit line and the word line;

means for popping the memory cell selector with an operation current between the bit line and the word line such that the memory cell selector becomes conductive;

means for setting a timer in response to the memory cell selector popping;

means for supplying the operation current for at least a predefined time period based on the timer to perform an operation on the memory cell with the operation current; and means for detecting the memory cell selector popping by detecting a first crossing of an electrical spike threshold by the operation current and a second crossing of the electrical spike threshold by the operation current.

* * * * *